US010236392B2

(12) United States Patent
Yamazaki et al.

(10) Patent No.: US 10,236,392 B2
(45) Date of Patent: Mar. 19, 2019

(54) TRANSISTOR AND SEMICONDUCTOR DEVICE

(71) Applicant: Semiconductor Energy Laboratory Co., Ltd., Atsugi-shi, Kanagawa-ken (JP)

(72) Inventors: Shunpei Yamazaki, Tokyo (JP); Masayuki Sakakura, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/952,433

(22) Filed: Apr. 13, 2018

(65) Prior Publication Data

US 2018/0233601 A1  Aug. 16, 2018

Related U.S. Application Data

(63) Continuation of application No. 14/669,459, filed on Mar. 26, 2015, now Pat. No. 9,947,801.

(30) Foreign Application Priority Data

Mar. 28, 2014 (JP) .................................. 2014-069534

(51) Int. Cl.
*H01L 29/12* (2006.01)
*H01L 29/786* (2006.01)
(Continued)

(52) U.S. Cl.
CPC .... *H01L 29/78693* (2013.01); *H01L 27/0688* (2013.01); *H01L 27/092* (2013.01);
(Continued)

(58) Field of Classification Search
None
See application file for complete search history.

(56) References Cited

U.S. PATENT DOCUMENTS 5,731,856 A  3/1998  Kim et al.
5,736,435 A  4/1998  Venkatesan et al.
(Continued)

FOREIGN PATENT DOCUMENTS

CN  102376584 A  3/2012
CN  102738168 A  10/2012
(Continued)

OTHER PUBLICATIONS

Taiwanese Office Action (Application No. 104108652) dated May 25, 2018.
(Continued)

*Primary Examiner* — Thien F Tran
(74) *Attorney, Agent, or Firm* — Fish & Richardson P.C.

(57) ABSTRACT

A transistor with small parasitic capacitance can be provided. A transistor with high frequency characteristics can be provided. A semiconductor device including the transistor can be provided. Provided is a transistor including an oxide semiconductor, a first conductor, a second conductor, a third conductor, a first insulator, and a second insulator. The first conductor has a first region where the first conductor overlaps with the oxide semiconductor with the first insulator positioned therebetween; a second region where the first conductor overlaps with the second conductor with the first and second insulators positioned therebetween; and a third region where the first conductor overlaps with the third conductor with the first and second insulators positioned therebetween. The oxide semiconductor including a fourth region where the oxide semiconductor is in contact with the second conductor; and a fifth region where the oxide semiconductor is in contact with the third conductor.

9 Claims, 22 Drawing Sheets

(51) Int. Cl.
*H01L 27/092* (2006.01)
*H01L 29/04* (2006.01)
*H01L 29/10* (2006.01)
*H01L 27/06* (2006.01)
*H01L 27/12* (2006.01)
*H01L 29/417* (2006.01)
*H01L 29/423* (2006.01)
*H01L 21/8238* (2006.01)

(52) U.S. Cl.
CPC ........ *H01L 27/1225* (2013.01); *H01L 29/045* (2013.01); *H01L 29/105* (2013.01); *H01L 29/41733* (2013.01); *H01L 29/42384* (2013.01); *H01L 29/78648* (2013.01); *H01L 29/78696* (2013.01); *H01L 21/823807* (2013.01); *H01L 2029/42388* (2013.01)

(56) References Cited

U.S. PATENT DOCUMENTS

| | | |
|---|---|---|
| 5,744,864 A | 4/1998 | Cillessen et al. |
| 6,291,278 B1 | 9/2001 | Xiang et al. |
| 6,294,274 B1 | 9/2001 | Kawazoe et al. |
| 6,524,903 B2 | 2/2003 | Ootsuka et al. |
| 6,563,174 B2 | 5/2003 | Kawasaki et al. |
| 6,673,683 B1 | 1/2004 | Sheu et al. |
| 6,727,522 B1 | 4/2004 | Kawasaki et al. |
| 6,841,831 B2 | 1/2005 | Hanafi et al. |
| 7,042,051 B2 | 5/2006 | Ootsuka et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,101,762 B2 | 9/2006 | Cohen et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,274,079 B2 | 9/2012 | Yamazaki |
| 8,372,198 B2 | 2/2013 | Seo et al. |
| 8,547,771 B2 | 10/2013 | Koyama |
| 8,674,354 B2 | 3/2014 | Yamazaki |
| 8,686,486 B2 | 4/2014 | Kato et al. |
| 8,748,881 B2 | 6/2014 | Yamazaki |
| 8,766,255 B2 | 7/2014 | Isobe et al. |
| 8,772,849 B2 | 7/2014 | Noda |
| 8,779,420 B2 | 7/2014 | Yamazaki |
| 8,779,432 B2 | 7/2014 | Yamazaki et al. |
| 8,785,923 B2 | 7/2014 | Noda |
| 8,809,853 B2 | 8/2014 | Saito et al. |
| 8,809,854 B2 | 8/2014 | Isobe et al. |
| 8,809,870 B2 | 8/2014 | Yamazaki et al. |
| 8,835,917 B2 | 9/2014 | Yamazaki et al. |
| 8,847,233 B2 | 9/2014 | Isobe et al. |
| 8,865,555 B2 | 10/2014 | Yamazaki et al. |
| 8,878,180 B2 | 11/2014 | Yamazaki |
| 8,878,288 B2 | 11/2014 | Isobe et al. |
| 8,916,868 B2 | 12/2014 | Isobe et al. |
| 8,932,913 B2 | 1/2015 | Sasagawa et al. |
| 8,946,812 B2 | 2/2015 | Ishizuka et al. |
| 9,059,219 B2 | 6/2015 | Sasagawa et al. |
| 9,202,923 B2 | 12/2015 | Yamazaki |
| 9,214,520 B2 | 12/2015 | Yamazaki |
| 9,293,602 B2 | 3/2016 | Yamazaki |
| 9,324,877 B2 | 4/2016 | Yamazaki et al. |
| 9,660,104 B2 | 5/2017 | Yamazaki |
| 9,685,562 B2 | 6/2017 | Yamazaki et al. |
| 9,728,555 B2 | 8/2017 | Yamazaki |
| 9,887,298 B2 | 2/2018 | Yamazaki |
| 9,991,288 B2 | 6/2018 | Yamazaki |
| 2001/0046027 A1 | 11/2001 | Tai et al. |
| 2002/0043665 A1 | 4/2002 | Ootsuka et al. |
| 2002/0056838 A1 | 5/2002 | Ogawa |
| 2002/0132454 A1 | 9/2002 | Ohtsu et al. |
| 2003/0094627 A1 | 5/2003 | Ootsuka et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |

(56) References Cited

U.S. PATENT DOCUMENTS

| | | |
|---|---|---|
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0133177 A1 | 6/2011 | Suzawa et al. |
| 2011/0156022 A1 | 6/2011 | Yamazaki et al. |
| 2012/0025191 A1 | 2/2012 | Yamazaki |
| 2012/0032163 A1 | 2/2012 | Yamazaki |
| 2012/0187475 A1 | 7/2012 | Yamazaki et al. |
| 2012/0199842 A1 | 8/2012 | Takemura |
| 2012/0223310 A1 | 9/2012 | Noda et al. |
| 2012/0248544 A1 | 10/2012 | Yokoyama |
| 2013/0009146 A1 | 1/2013 | Nomura et al. |
| 2013/0285050 A1 | 10/2013 | Yamazaki et al. |
| 2013/0320332 A1 | 12/2013 | Hondo et al. |
| 2014/0027764 A1 | 1/2014 | Yamazaki et al. |
| 2014/0339548 A1 | 11/2014 | Yamazaki et al. |
| 2014/0339549 A1 | 11/2014 | Yamazaki et al. |
| 2015/0008430 A1 | 1/2015 | Yamazaki et al. |
| 2016/0218219 A1* | 7/2016 | Asami .............. H01L 29/0649 |
| 2017/0373193 A1 | 12/2017 | Yamazaki et al. |
| 2018/0211980 A1 | 7/2018 | Yamazaki |

FOREIGN PATENT DOCUMENTS

| | | |
|---|---|---|
| EP | 1737044 A | 12/2006 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-009289 A | 1/2002 |
| JP | 2002-076356 A | 3/2002 |
| JP | 2002-198529 A | 7/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2011-181913 A | 9/2011 |
| JP | 2012-049514 A | 3/2012 |
| JP | 2012-054547 A | 3/2012 |
| JP | 2012-084858 A | 4/2012 |
| JP | 2012-216776 A | 11/2012 |
| JP | 2012-257187 A | 12/2012 |
| JP | 2014-029994 A | 2/2014 |
| JP | 2014-042005 A | 3/2014 |
| JP | 2014-057056 A | 3/2014 |
| KR | 2002-0033409 A | 5/2002 |
| KR | 2012-0022614 A | 3/2012 |
| KR | 2014-0013972 A | 2/2014 |
| TW | 522548 | 3/2003 |
| TW | 201220352 | 5/2012 |
| TW | 201222734 | 6/2012 |
| TW | 201251020 | 12/2012 |
| TW | 201306265 | 2/2013 |
| TW | 201411847 | 3/2014 |
| WO | WO-2004/114391 | 12/2004 |
| WO | WO-2011/065243 | 6/2011 |
| WO | WO-2011/096263 | 8/2011 |
| WO | WO-2012/014786 | 2/2012 |

OTHER PUBLICATIONS

Munzenrieder.N et al., "Flexible Self-Aligned Double-Gate IGZO TFT", IEEE Electron Device Letters, 2014, vol. 35, No. 1, pp. 69-71.

Coates.D et al., "Optical Studies of the Amorphous Liquid-Cholesteric Liquid Crystal Transition:The "Blue Phase"", Physics Letters, September 10, 1973, vol. 45A, No. 2, pp. 115-116.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "Spinel,YbFe2O4, and Yb2Fe3O7 Types of Structures for Compounds in the In2O3 and Sc2O3—A2O3—BO SYSTEMS [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m=3, 4, and 5), InGaO3(ZnO)3, and GaZO3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17- 22.

(56) References Cited

OTHER PUBLICATIONS

Park.S et al., "Challenge to Future Displays: Transparent AM-OLED Driven by PEALD Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "Suftla Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits , 2008, vol. 43, No. 1, pp. 292-299.

Jeong.J et al., "3.1: Distinguished Paper: 12.1-Inch WXGA AMOLED Display Driven by Indium-Gallium-Zinc Oxide TFTs Array", SID DIGEST '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium-Gallium-Zinc Oxide TFTS and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW'08 : Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn-Oxide TFTS", IDW'09 : Proceedings of the 16th International Display Workshops, 2009, pp. 689-692.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Backplane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Ohara.H et al., "21.3:4.0 In. QVGA AMOLED Display Using In—Ga—Zn-Oxide TFTS With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191- 194.

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters) , 2005, vol. 87, pp. 122102-1-122102-3.

Clark.S et al., "First Principles Methods Using Castep", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure To Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-

(56) References Cited

OTHER PUBLICATIONS

FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

International Search Report (Application No. PCT/IB2015/051838) dated Jul. 7, 2015.

Written Opinion (Application No. PCT/IB2015/051838) dated Jul. 7, 2015.

* cited by examiner

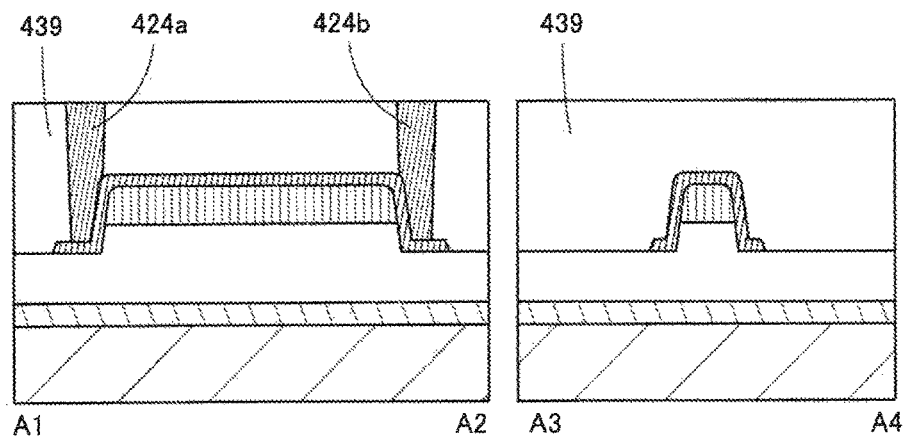
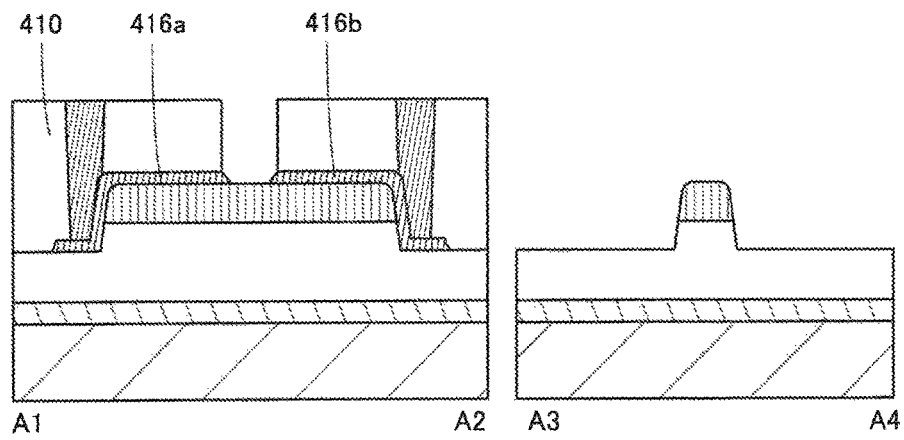

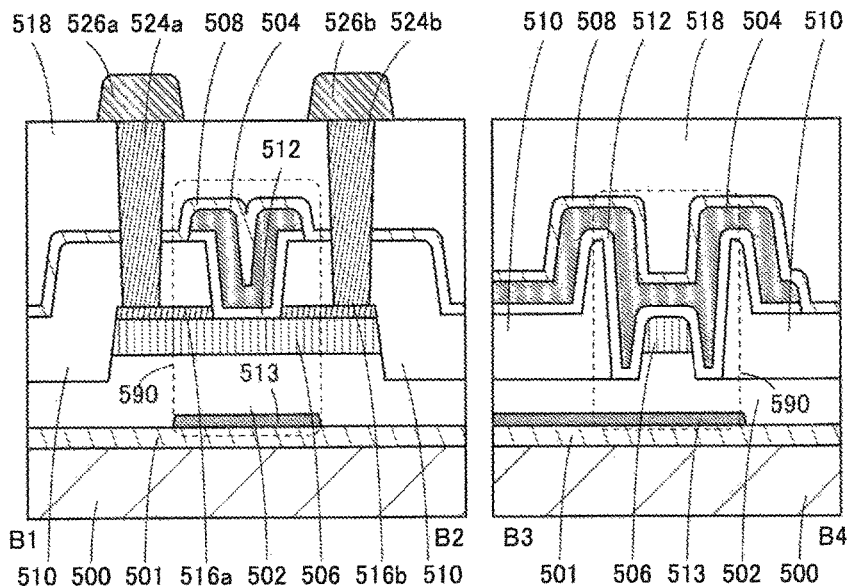
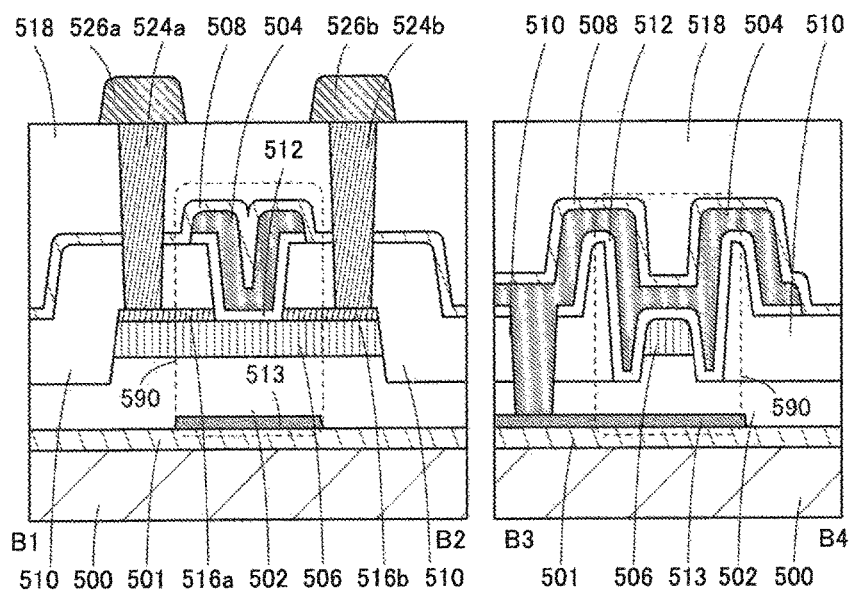

2100    2200

2100    2200

TRANSISTOR AND SEMICONDUCTOR DEVICE

CROSS-REFERENCE TO RELATED APPLICATIONS

This application is a continuation of U.S. application Ser. No. 14/669,459, filed Mar. 26, 2015, now allowed, which claims the benefit of a foreign priority application filed in Japan as Serial No. 2014-069534 on Mar. 28, 2014, both of which are incorporated by reference.

TECHNICAL FIELD

The present invention relates to a transistor and a semiconductor device, and a manufacturing method thereof, for example. The present invention relates to a display device, a light-emitting device, a lighting device, a power storage device, a memory device, a processor, or an electronic device, for example. The present invention relates to a method for manufacturing a display device, a liquid crystal display device, a light-emitting device, a memory device, or an electronic device. The present invention relates to a driving method of a semiconductor device, a display device, a liquid crystal display device, a light-emitting device, a memory device, or an electronic device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter.

In this specification and the like, a semiconductor device generally means a device that can function by utilizing semiconductor characteristics. A display device, a light-emitting device, a lighting device, an electro-optical device, a semiconductor circuit, and an electronic device include a semiconductor device in some cases.

BACKGROUND ART

In recent years, a transistor including an oxide semiconductor has attracted attention. An oxide semiconductor can be formed by a sputtering method or the like, and thus can be used for a semiconductor of a transistor in a large display device. In addition, there is an advantage in a transistor including an oxide semiconductor that capital investment can be reduced because part of production equipment for a transistor including amorphous silicon can be retrofitted and utilized.

It is known that a transistor including an oxide semiconductor has an extremely low leakage current in an off state. For example, a low-power CPU and the like utilizing the characteristics that a leakage current of the transistor including an oxide semiconductor is low is disclosed (see Patent Document 1).

PATENT DOCUMENT

[Patent Document 1] Japanese Published Patent Application No. 2012-257187

DISCLOSURE OF INVENTION

An object is to provide a transistor with low parasitic capacitance. Another object is to provide a transistor with high frequency characteristics. Another object is to provide a transistor with favorable electrical characteristics. Another object is to provide a transistor with stable electrical characteristics. Another object is to provide a transistor with low off-state current. Another object is to provide a novel transistor. Another object is to provide a semiconductor device including the transistor. Another object is to provide a semiconductor device which can operate at high speed. Another object is to provide a novel semiconductor device. Another object is to provide a module including the semiconductor device. Another object is to provide an electronic device including the semiconductor device or the module.

Note that the descriptions of these objects do not disturb the existence of other objects. In one embodiment of the present invention, there is no need to achieve all the objects. Other objects will be apparent from and can be derived from the description of the specification, the drawings, the claims, and the like.

(1) One embodiment of the present invention is a transistor including an oxide semiconductor, a first conductor, a second conductor, a third conductor, a first insulator, and a second insulator. The first conductor includes a first region, a second region, and a third region. The first region has a region where the first conductor overlaps with the oxide semiconductor with the first insulator positioned therebetween, the second region has a region where the first conductor overlaps with the second conductor with the first insulator and the second insulator positioned therebetween, and the third region has a region where the first conductor overlaps with the third conductor with the first insulator and the second insulator positioned therebetween. The oxide semiconductor includes a fourth region and a fifth region. The fourth region has a region where the oxide semiconductor is in contact with the second conductor, and the fifth region has a region where the oxide semiconductor is in contact with the third conductor.

(2) One embodiment of the present invention is a semiconductor device including a p-channel transistor and an n-channel transistor. A source or a drain of the p-channel transistor is electrically connected to a source or a drain of the n-channel transistor, and a gate of the p-channel transistor is electrically connected to a gate of the n-channel transistor. The p-channel transistor includes silicon in a channel formation region, and the n-channel transistor is the transistor described in (1).

(3) One embodiment of the present invention is the semiconductor device described in (2) where the p-channel transistor is formed using a silicon substrate whose crystal plane in the top surface includes a region of a (110) plane.

(4) One embodiment of the present invention is the semiconductor device described in (2) or (3) where a channel formation region of the p-channel transistor has a concentration gradient such that a concentration of an impurity imparting an n-type conductivity gets higher toward a vicinity of a surface of the channel formation region.

(5) One embodiment of the present invention is the semiconductor device described in any one of (2) to (4) where the gate of the p-channel transistor includes a conductor with a work function of 4.5 eV or higher.

(6) One embodiment of the present invention is the semiconductor device described in any one of (2) to (5) where the oxide semiconductor contains indium.

(7) One embodiment of the present invention is the semiconductor device described in any one of (2) to (6) where the oxide semiconductor includes a first oxide semiconductor layer, a second oxide semiconductor layer, and a third oxide semiconductor layer, and has a region where the first oxide semiconductor layer, the second oxide semiconductor layer, and the third oxide semiconductor layer overlap with each other.

Note that in the semiconductor device of one embodiment of the present invention, the oxide semiconductor may be replaced with another semiconductor.

A transistor with low parasitic capacitance can be provided. A transistor with high frequency characteristics can be provided. A transistor with favorable electrical characteristics can be provided. A transistor with stable electrical characteristics can be provided. A transistor with low off-state current can be provided. A novel transistor can be provided. A semiconductor device including the transistor can be provided. A semiconductor device which can operate at high speed can be provided. A novel semiconductor device can be provided. A module including the semiconductor device can be provided. Furthermore, an electronic device including the semiconductor device or the module can be provided.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF DRAWINGS

In the accompanying drawings:

FIGS. 7A and 7B are cross-sectional views illustrating a method for manufacturing a transistor of one embodiment of the present invention;

FIGS. 10A and 10B are cross-sectional views each illustrating a transistor of one embodiment of the present invention;

BEST MODE FOR CARRYING OUT THE INVENTION

Figure 1A:
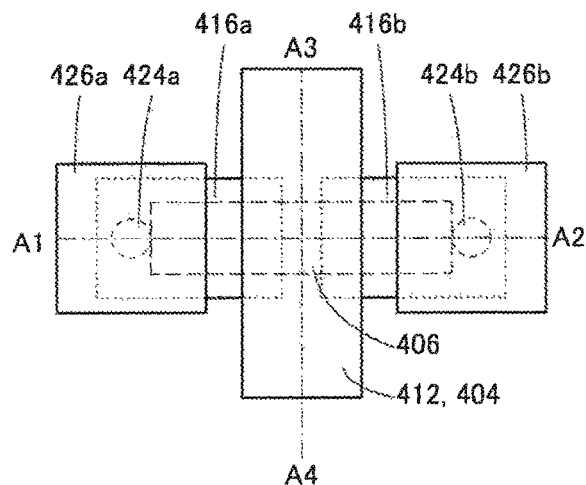
FIGS. 1A and 1B are a top view and a cross-sectional view illustrating a transistor of one embodiment of the present invention.

Hereinafter, embodiments of the present invention will be described in detail with the reference to the drawings. However, the present invention is not limited to the description below, and it is easily understood by those skilled in the art that embodiments and details disclosed herein can be modified in various ways. Further, the present invention is not construed as being limited to description of the embodiments and the examples. In describing structures of the present invention with reference to the drawings, common reference numerals are used for the same portions in different drawings. Note that the same hatched pattern is applied to similar parts, and the similar parts are not especially denoted by reference numerals in some cases.

Note that the size, the thickness of films (layers), or the region in drawings is sometimes exaggerated for simplicity.

In this specification, for example, for describing the shape of an object, the length of one side of a minimal cube where the object fits, or an equivalent circle diameter of a cross section of the object can be interpreted as the "diameter", "grain size (diameter)", "dimension", "size", or "width" of the object. The term "equivalent circle diameter of a cross section of the object" refers to the diameter of a perfect circle having the same area as the cross section of the object.

Note that a voltage refers to a potential difference between a certain potential and a reference potential (e.g., a ground potential (GND) or a source potential) in many cases. A voltage can be referred to as a potential and vice versa.

Note that the ordinal numbers such as "first" and "second" in this specification are used for convenience and do not denote the order of steps or the stacking order of layers. Therefore, for example, the term "first" can be replaced with the term "second", "third", or the like as appropriate. In addition, the ordinal numbers in this specification and the like are not necessarily the same as those which specify one embodiment of the present invention.

Note that a "semiconductor" includes characteristics of an "insulator" in some cases when the conductivity is sufficiently low, for example. Further, a "semiconductor" and an "insulator" cannot be strictly distinguished from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

Further, a "semiconductor" includes characteristics of a "conductor" in some cases when the conductivity is sufficiently high, for example. Further, a "semiconductor" and a "conductor" cannot be strictly distinguished from each other in some cases because a border between the "semiconductor" and the "conductor" is not clear. Accordingly, a "semiconductor" in this specification can be called a "conductor" in some cases. Similarly, a "conductor" in this specification can be called a "semiconductor" in some cases.

Note that an impurity in a semiconductor refers to, for example, elements other than the main components of the semiconductor. For example, an element with a concentration of lower than 0.1 atomic % is an impurity. When an impurity is contained, density of states (DOS) may be formed in the semiconductor film, the carrier mobility may be decreased, or the crystallinity may be lowered, for example. In the case where the semiconductor is an oxide semiconductor, examples of an impurity which changes characteristics of the semiconductor include Group 1 elements, Group 2 elements, Group 14 elements, Group 15 elements, and transition metals other than the main components; specifically, there are hydrogen (included in water), lithium, sodium, silicon, boron, phosphorus, carbon, and nitrogen, for example. In the case of an oxide semiconductor, oxygen vacancy may be formed by entry of impurities such as hydrogen. Further, in the case where the semiconductor is a silicon film, examples of an impurity which changes characteristics of the semiconductor include oxygen, Group 1 elements except hydrogen, Group 2 elements, Group 13 elements, and Group 15 elements.

In this specification, the phrase "A has a region with a concentration B" includes, for example, "the concentration of the entire region in a region of A in the depth direction is B", "the average concentration in a region of A in the depth direction is B", "the median value of a concentration in a region of A in the depth direction is B", "the maximum value of a concentration in a region of A in the depth direction is B", "the minimum value of a concentration in a region of A in the depth direction is B", "a convergence value of a concentration in a region of A in the depth direction is B", and "a concentration in a region of A in which a probable value is obtained in measurement is B".

In this specification, the phrase "A has a region with a size B, a length B, a thickness B, a width B, or a distance B" includes, for example, "the size, the length, the thickness, the width, or the distance of the entire region in a region of A is B", "the average value of the size, the length, the thickness, the width, or the distance of a region of A is B", "the median value of the size, the length, the thickness, the width, or the distance of a region of A is B", "the maximum value of the size, the length, the thickness, the width, or the distance of a region of A is B", "the minimum value of the size, the length, the thickness, the width, or the distance of a region of A is B", "a convergence value of the size, the length, the thickness, the width, or the distance of a region of A is B", and "the size, the length, the thickness, the width, or the distance of a region of A in which a probable value is obtained in measurement is B".

Note that the channel length refers to, for example, a distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions do not necessarily have the same value. In other words, a channel width of one transistor is not fixed to one value in some cases. Therefore, in this specification, a channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is higher than the proportion of a channel region formed in a top surface of a semiconductor in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Further, in this specification, in the case where the term "channel width" is simply used, it may denote a surrounded channel width and an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where electric field mobility, a current value per channel width, and the like of a transistor are obtained by calculation, a surrounded channel width may be used for the calculation. In that case, a value different from one in the case where an effective channel width is used for the calculation is obtained in some cases.

Note that in this specification, the description "A has a shape jutting out from B" may indicate, for example, the case where at least one of end portions of A is positioned on an outer side than at least one of end portions of B in a top view or a cross-sectional view. Thus, the description "A has a shape jutting out from B" can be alternately referred to as the description "one of end portions of A is positioned on an outer side than one of end portions of B".

In this specification, the term "parallel" indicates that the angle formed between two straight lines is greater than or equal to −10° and less than or equal to 10°, and accordingly also includes the case where the angle is greater than or equal to −5° and less than or equal to 5°. The term "perpendicular" indicates that the angle formed between two straight lines is greater than or equal to 80° and less than or equal to 100°, and accordingly includes the case where the angle is greater than or equal to 85° and less than or equal to 95°.

In this specification, the trigonal and rhombohedral crystal systems are included in the hexagonal crystal system.

<Structure of Transistor>

The structures of transistors of embodiments of the present invention will be described below.

<Transistor Structure 1>

Figure 1B:
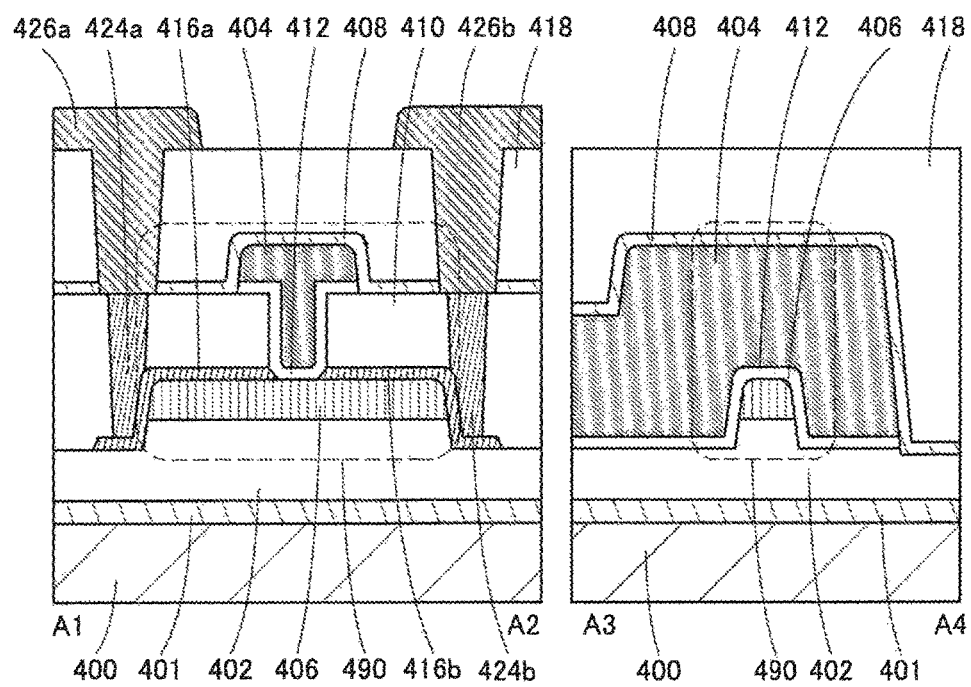

FIGS. 1A and 1B are a top view and a cross-sectional view of a transistor 490 of one embodiment of the present invention. FIG. 1A is the top view. FIG. 1B is the cross-sectional view taken along dashed-dotted line A1-A2 and dashed-dotted line A3-A4 in FIG. 1A. Note that for simplification of the drawing, some components are not illustrated in the top view in FIG. 1A.

In FIG. 1B, the transistor 490 includes an insulator 401 over a substrate 400, an insulator 402 over the insulator 401, a semiconductor 406 over the insulator 402, conductors 416a and 416b each include a region in contact with top and side surfaces of the semiconductor 406, an insulator 410 that is in contact with top surfaces of the conductors 416a and 416b and has an opening reaching the conductor 416a and another opening reaching the conductor 416b, a conductor 424a and a conductor 424b in contact with the conductor 416a and the conductor 416b, respectively, through the openings in the insulator 410, an insulator 412 in contact with the top surface of the semiconductor 406, a conductor 404 over the semiconductor 406 with the insulator 412 provided therebetween, and an insulator 408 over the insulator 410 and the conductor 404.

Note that the transistor 490 does not necessarily include the insulator 401. Note that the transistor 490 does not necessarily include the insulator 402. Note that the transistor 490 does not necessarily include the insulator 408. Note that the transistor 490 does not necessarily include the conductor 424a. Note that the transistor 490 does not necessarily include the conductor 424b.

In FIG. 1B, an insulator 418 including an opening reaching the conductor 424a and another opening reaching the conductor 424b, a conductor 426a and a conductor 426b in contact with the conductor 424a and the conductor 424b, respectively, through the openings in the insulator 418 are over the insulator 408 of the transistor 490.

In the transistor 490, the conductor 404 serves as a gate electrode. The insulator 412 serves as a gate insulator. The conductor 416a and the conductor 416b serve as a source electrode and a drain electrode. Therefore, resistance of the semiconductor 406 can be controlled by a potential applied to the conductor 404. That is, conduction or non-conduction between the conductors 416a and 416b can be controlled by the potential applied to the conductor 404.

In the transistor 490, the conductor 404 includes a region overlapping with the conductor 416a with the insulator 410 provided therebetween, and a region overlapping with the conductor 416b with the insulator 410 provided therebetween. The transistor 490 includes the insulator 410 between the conductor 404 and the conductor 416a, and between the conductor 404 and the conductor 416b, whereby parasitic capacitance can be reduced. Thus, the transistor 490 has high frequency characteristics.

As illustrated in FIG. 1B, the side surfaces of the semiconductor 406 are in contact with the conductors 416a and 416b. In addition, the semiconductor 406 can be electrically surrounded by an electric field of the conductor 404 serving as the gate electrode. A structure in which a semiconductor is electrically surrounded by an electric field of a gate electrode is referred to as a surrounded channel (s-channel) structure. Therefore, a channel is formed in the entire semiconductor 406 (bulk) in some cases. In the s-channel structure, a large amount of current can flow between a source and a drain of the transistor, so that an on-state current can be increased. In addition, since the semiconductor 406 is surrounded by the electric field of the conductor 404, an off-state current can be decreased.

Note that electrical characteristics of the transistor 490 can be stabilized when the transistor 490 is surrounded by an insulator with a function of blocking oxygen and impurities such as hydrogen. For example, an insulator with a function of blocking oxygen and impurities such as hydrogen may be used as the insulator 401 and the insulator 408.

An insulator with a function of blocking oxygen and impurities such as hydrogen may have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum may be used.

For example, the insulator 401 may be formed of aluminum oxide, magnesium oxide, silicon nitride oxide, silicon nitride, gallium oxide, germanium oxide, yttrium oxide, zirconium oxide, lanthanum oxide, neodymium oxide, hafnium oxide, or tantalum oxide. Note that the insulator 401 preferably includes aluminum oxide or silicon nitride. The insulator 401 including aluminum oxide or silicon nitride can suppress entry of impurities such as hydrogen into the semiconductor 406, and can reduce outward diffusion of oxygen, for example.

Furthermore, for example, the insulator 408 may be formed of aluminum oxide, magnesium oxide, silicon nitride oxide, silicon nitride, gallium oxide, germanium oxide, yttrium oxide, zirconium oxide, lanthanum oxide, neodymium oxide, hafnium oxide, or tantalum oxide. Note that the insulator 408 preferably includes aluminum oxide or silicon nitride. The insulator 408 including aluminum oxide or silicon nitride can suppress entry of impurities such as hydrogen into the semiconductor 406, and can reduce outward diffusion of oxygen, for example.

The insulator 402 may have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 402 may be formed of, for example, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

The insulator 402 may have a function of preventing diffusion of impurities from the substrate 400. In the case where the semiconductor 406 is an oxide semiconductor, the insulator 402 can have a function of supplying oxygen to the semiconductor 406.

Each of the conductor 416a and the conductor 416b may have a single-layer structure or a stacked-layer structure including a conductor containing, for example, one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound may be used, for example, and a conductor containing aluminum, a conductor containing copper and titanium, a conductor containing copper and manganese, a conductor containing indium, tin, and oxygen, a conductor containing titanium and nitrogen, or the like may be used.

An offset region or an overlap region can be formed depending on the shape of the end portion of the conductor 416a or 416b.

Figure 2A:
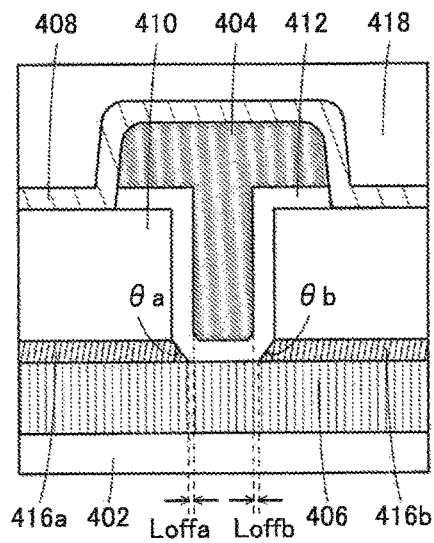
FIGS. 2A to 2D are cross-sectional views each illustrating part of a transistor of one embodiment of the present invention.
Figure 2B:
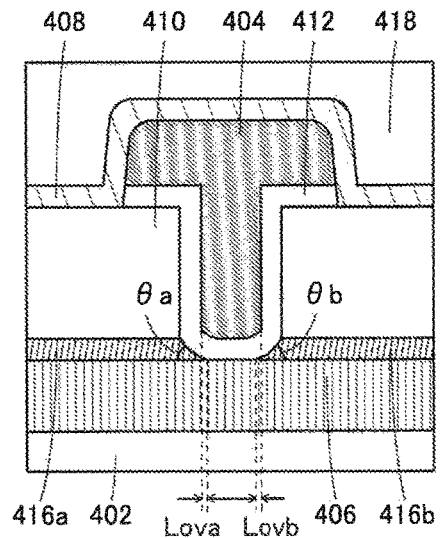

In cross-sectional views in FIGS. 2A and 2B, θa is an angle between the top surface of the semiconductor 406 and a side surface of the conductor 416a at the end portion of the conductor 416a, and θb is an angle between the top surface of the semiconductor 406 and a side surface of the conductor 416b at the end portion of the conductor 416b. Note that when there is a range in angle at the end portion of the conductor 416a or at the end portion of the conductor 416b, the average value, the median value, the minimum value, or the maximum value of the angles is regarded as θa or θb.

In FIG. 2A, θa is large and the jutting amount of the conductor 416a is smaller than the thickness of the insulator 412, whereby an offset region Loffa is formed. Similarly, θb in FIG. 2A is large and the jutting amount of the conductor 416b is smaller than the thickness of the insulator 412, whereby an offset region Loffb is formed. For example, θa and θb may be each larger than or equal to 60° and smaller than 90°. Note that the size of Loffa and that of Loffb may be the same or different from each other. When the size of Loffa and that of Loffb are the same, for example, variation in electrical characteristics or shapes of a plurality of transistors 490 in a semiconductor device can be reduced. In contrast, when the size of Loffa and that of Loffb are different from each other, deterioration of the transistor 490 due to concentration of an electric field in a certain region can be reduced in some cases.

In FIG. 2B, θa is small and the jutting amount of the conductor 416a is larger than the thickness of the insulator 412, whereby an overlap region Lova is formed. Similarly, θb in FIG. 2B is small and the jutting amount of the conductor 416b is larger than the thickness of the insulator 412, whereby an overlap region Lovb is formed. For example, θa and θb may be each larger than or equal to 15° and smaller than 60°, or larger than or equal to 20° and smaller than 50°. Note that the size of Lova and that of Lovb may be the same or different from each other. When the size of Lova and that of Lovb are the same, for example, variation in electrical characteristics or shapes of a plurality of transistors 490 in a semiconductor device can be reduced. In contrast, when the size of Lova and that of Lovb are different from each other, deterioration of the transistor 490 due to concentration of an electric field in a certain region can be reduced in some cases.

Note that the transistor 490 may include both the overlap region and the offset region. For example, with Lova and Loffb, the on-state current can be increased, while the deterioration of the transistor 490 due to concentration of an electric field in a certain region can be reduced.

Figure 2C:
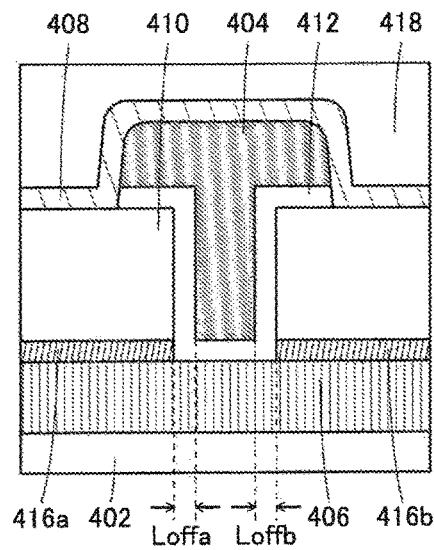

In a cross-sectional view in FIG. 2C, the angle between the top surface of the semiconductor 406 and the side surface of the conductor 416a is approximately 90° at the end portion of the conductor 416a, and the angle between the top surface of the semiconductor 406 and the side surface of the conductor 416b is approximately 90° at the end portion of the conductor 416b. In that case, the thickness of the insulator 412 corresponds to the length of the offset region (denoted by Loffa or Loffb in FIG. 2C).

Figure 2D:
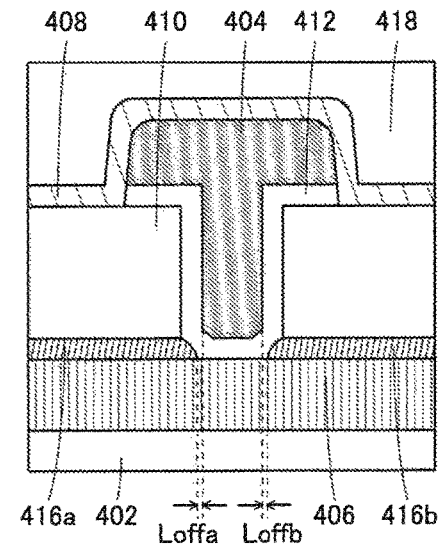

In a cross-sectional view in FIG. 2D, the end portions of the conductors 416a and 416b have curved surfaces. With the curved surfaces of the end portions of the conductors 416a and 416b, concentration of an electric field in the end portions may be reduced. Therefore, the deterioration of the transistor 490 due to the concentration of the electric field may be reduced.

The insulator 410 may have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, the insulator 410 can be formed of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

Note that the insulator 410 preferably includes an insulator with low relative permittivity. For example, the insulator 410 preferably includes silicon oxide, silicon oxynitride, silicon nitride oxide, silicon nitride, resin, or the like. Alternatively, the insulator 410 preferably has a stacked-layer structure of silicon oxide or silicon oxynitride and resin. When silicon oxide or silicon oxynitride, which is thermally stable, is combined with resin, the stacked-layer structure can have thermal stability and low relative permittivity. Examples of the resin include polyester, polyolefin, polyamide (e.g., nylon or aramid), polyimide, polycarbonate, and acrylic.

The insulator 412 may have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 412 may be formed of, for example, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

The insulator 412 preferably includes an insulator with high relative permittivity. For example, the insulator 412 preferably includes gallium oxide, hafnium oxide, oxide including aluminum and hafnium, oxynitride including aluminum and hafnium, oxide including silicon and hafnium, oxynitride including silicon and hafnium, or the like. Alternatively, the insulator 412 preferably has a stacked-layer structure of silicon oxide or silicon oxynitride and an insulator with high relative permittivity. When silicon oxide or silicon oxynitride, which is thermally stable, is combined with an insulator with high relative permittivity, the stacked-layer structure can have thermal stability and high relative permittivity. For example, when an aluminum oxide, a gallium oxide, or a hafnium oxide of the insulator 412 is on the semiconductor 406 side, entry of silicon included in the silicon oxide or the silicon oxynitride into the semiconductor 406 can be suppressed. Alternatively, when the silicon oxide or the silicon oxynitride is on the semiconductor 406 side, a trap center may be formed at an interface between the aluminum oxide, the gallium oxide, or the hafnium oxide, and the silicon oxide or the silicon oxynitride in some cases. Trapping an electron, the trap center can shift a threshold voltage of the transistor in a positive direction in some cases.

The conductor 404 may have a single-layer structure or a stacked-layer structure including a conductor containing, for example, one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound may be used, for example, and a conductor containing aluminum, a conductor containing copper and titanium, a conductor containing copper and manganese, a conductor containing indium, tin, and oxygen, a conductor containing titanium and nitrogen, or the like may be used.

Each of the conductor 424a and the conductor 424b may have a single-layer structure or a stacked-layer structure including a conductor containing, for example, one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound may be used, for example, and a conductor containing aluminum, a conductor containing copper and titanium, a conductor containing copper and manganese, a conductor containing indium, tin, and oxygen, a conductor containing titanium and nitrogen, or the like may be used.

Each of the conductor 426a and the conductor 426b may have a single-layer structure or a stacked-layer structure including a conductor containing, for example, one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound may be used, for example, and a conductor containing aluminum, a conductor containing copper and titanium, a conductor containing copper and manganese, a conductor containing indium, tin, and oxygen, a conductor containing titanium and nitrogen, or the like may be used.

The insulator 418 may have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 418 may be formed with, for example, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

Note that the insulator 418 preferably includes an insulator with low relative permittivity. For example, the insulator 418 preferably includes silicon oxide, silicon oxynitride, silicon nitride oxide, silicon nitride, resin, or the like. Alternatively, the insulator 418 preferably has a stacked-layer structure of silicon oxide or silicon oxynitride and resin. When silicon oxide or silicon oxynitride, which is thermally stable, is combined with resin, the stacked-layer structure can have thermal stability and low relative permittivity. Examples of the resin include polyester, polyolefin, polyamide (e.g., nylon or aramid), polyimide, polycarbonate, and acrylic.

An oxide semiconductor is preferably used as the semiconductor 406. However, silicon (including strained silicon), germanium, silicon germanium, silicon carbide, gallium arsenide, aluminum gallium arsenide, indium phosphide, gallium nitride, an organic semiconductor, or the like can be used in some cases.

A structure of an oxide semiconductor is described below.

Oxide semiconductors are classified roughly into a single-crystal oxide semiconductor and a non-single-crystal oxide semiconductor. The non-single-crystal oxide semiconductor includes any of a c-axis aligned crystalline oxide semiconductor (CAAC-OS), a polycrystalline oxide semiconductor, a microcrystalline oxide semiconductor, an amorphous oxide semiconductor, and the like.

First, a CAAC-OS is described.

A CAAC-OS is an oxide semiconductor having a plurality of c-axis aligned crystal parts.

With a transmission electron microscope (TEM), a combined analysis image (high-resolution TEM image) of a bright-field image and a diffraction pattern of the CAAC-OS is observed, and a plurality of crystal parts can be observed. However, in the high-resolution TEM image, a boundary between crystal parts, that is, a grain boundary is not clearly observed. Thus, in the CAAC-OS, a reduction in electron mobility due to the grain boundary is less likely to occur.

In the high-resolution cross-sectional TEM image of the CAAC-OS film observed in a direction substantially parallel to the sample surface, metal atoms arranged in a layered manner are seen in the crystal parts. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

In the high-resolution planar TEM image of the CAAC-OS observed in a direction substantially perpendicular to the sample surface, metal atoms arranged in a triangular or hexagonal configuration are seen in the crystal parts. However, there is no regularity of arrangement of metal atoms between different crystal parts.

A CAAC-OS is subjected to structural analysis with an X-ray diffraction (XRD) apparatus. For example, when the CAAC-OS including an $InGaZnO_4$ crystal is analyzed by an out-of-plane method, a peak appears frequently when the diffraction angle ($2\theta$) is around 31°. This peak is derived from the (009) plane of the $InGaZnO_4$ crystal, which indicates that crystals in the CAAC-OS have c-axis alignment, and that the c-axes are aligned in a direction substantially perpendicular to the formation surface or the top surface of the CAAC-OS.

Note that when the CAAC-OS with an $InGaZnO_4$ crystal is analyzed by an out-of-plane method, a peak of $2\theta$ may also be observed at around 36°, in addition to the peak of $2\theta$ at around 31°. The peak of $2\theta$ at around 36° indicates that a crystal having no c-axis alignment is included in part of the CAAC-OS. It is preferable that in the CAAC-OS, a peak of $2\theta$ appear at around 31° and a peak of $2\theta$ not appear at around 36°.

The CAAC-OS is an oxide semiconductor with a low impurity concentration. The impurity means here an element other than the main components of the oxide semiconductor, such as hydrogen, carbon, silicon, or a transition metal element. An element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity when included in the oxide semiconductor. Note that the impurity contained in the oxide semiconductor might serve as a carrier trap or a carrier generation source.

Moreover, the CAAC-OS is an oxide semiconductor having a low density of defect states. For example, oxygen vacancies in the oxide semiconductor serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor has few carrier generation sources, and thus has a low carrier density in some cases. Thus, a transistor including the oxide semiconductor rarely has a negative threshold voltage (is rarely normally on). The highly purified intrinsic or substantially highly purified intrinsic oxide semiconductor has few carrier traps. Accordingly, the transistor including the oxide semiconductor has little variation in electrical characteristics and high reliability. An electric charge trapped by the carrier traps in the oxide semiconductor takes a long time to be released. The trapped electric charge may behave like a fixed electric charge. Thus, the transistor which includes the oxide semiconductor having a high impurity concentration and a high density of defect states might have unstable electrical characteristics.

In a transistor using the CAAC-OS, change in electrical characteristics due to irradiation with visible light or ultraviolet light is small.

Next, a microcrystalline oxide semiconductor is described.

A microcrystalline oxide semiconductor has a region in which a crystal part is observed and a region in which a crystal part is not observed clearly in a high-resolution TEM image. In most cases, the size of a crystal part included in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor including nanocrystal is referred to as an nc-OS (nanocrystalline oxide semiconductor). In a high-resolution TEM image of the nc-OS, for example, a grain boundary is not clearly observed in some cases.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different crystal parts in the nc-OS. Thus, the orientation of the whole film is not observed. Accordingly, in some cases, the nc-OS cannot be distinguished from an amorphous oxide semiconductor, depending on an analysis method. For example, when the nc-OS is subjected to structural analysis by an out-of-plane method with an XRD apparatus using an X-ray having a diameter larger than the diameter of a crystal part, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a crystal part (the electron diffraction is also referred to as selected-area electron diffraction). Meanwhile, spots are shown in a nanobeam electron diffraction pattern of the nc-OS obtained by using an electron beam having a probe diameter close to, or smaller than the diameter of a crystal part. Moreover, in a nanobeam electron diffraction pattern of the nc-OS, regions with high luminance in a circular (ring) pattern are shown in some cases. Also in a nanobeam electron diffraction pattern of the nc-OS, a plurality of spots is shown in a ring-like region in some cases.

Thus, the nc-OS is an oxide semiconductor that has high regularity as compared to an amorphous oxide semiconductor. Therefore, the nc-OS is likely to have a lower density of defect states than an amorphous oxide semiconductor. However, there is no regularity of crystal orientation between different crystal parts in the nc-OS. Therefore, the nc-OS has a higher density of defect states than the CAAC-OS.

Next, an amorphous oxide semiconductor is described.

The amorphous oxide semiconductor is such an oxide semiconductor having disordered atomic arrangement and no crystal part. For example, the amorphous oxide semiconductor does not have a specific state as in quartz.

In a high-resolution TEM image of the amorphous oxide semiconductor, crystal parts cannot be found.

When the amorphous oxide semiconductor is subjected to structural analysis by an out-of-plane method with an XRD apparatus, a peak which shows a crystal plane does not appear. A halo pattern is observed when the amorphous oxide semiconductor is subjected to electron diffraction. Furthermore, a spot is not observed and a halo pattern appears when the amorphous oxide semiconductor is subjected to nanobeam electron diffraction.

Note that an oxide semiconductor may have a structure having physical properties intermediate between the nc-OS and the amorphous oxide semiconductor. The oxide semiconductor having such a structure is specifically referred to as an amorphous-like oxide semiconductor (a-like OS).

In a high-resolution TEM image of the a-like OS, a void may be observed. Furthermore, in the high-resolution TEM image, there are a region where a crystal part is clearly observed and a region where a crystal part is not observed. In the a-like OS film, crystallization by a slight amount of electron beam used for TEM observation occurs and growth of the crystal part is found sometimes. In contrast, crystallization by a slight amount of electron beam used for TEM observation is less observed in the nc-OS film having good quality.

Note that the crystal part size in the a-like OS film and the nc-OS film can be measured using high-resolution TEM images. For example, an $InGaZnO_4$ crystal has a layered structure in which two Ga—Zn—O layers are included between In—O layers. A unit lattice of the $InGaZnO_4$ crystal has a structure in which nine layers of three In—O layers and six Ga—Zn—O layers are layered in the c-axis direction. Accordingly, the spacing between these adjacent layers is equivalent to the lattice spacing on the (009) plane (also referred to as d value). The value is calculated to be 0.29 nm from crystal structural analysis. Thus, focusing on lattice fringes in the high-resolution TEM image, each of lattice fringes in which the lattice spacing therebetween is greater than or equal to 0.28 nm and less than or equal to 0.30 nm corresponds to the a-b plane of the $InGaZnO_4$ crystal.

Note that an oxide semiconductor may be a stacked-layer film including two or more films of an amorphous oxide semiconductor, an a-like OS, a microcrystalline oxide semiconductor, and a CAAC-OS, for example.

Figure 3A:
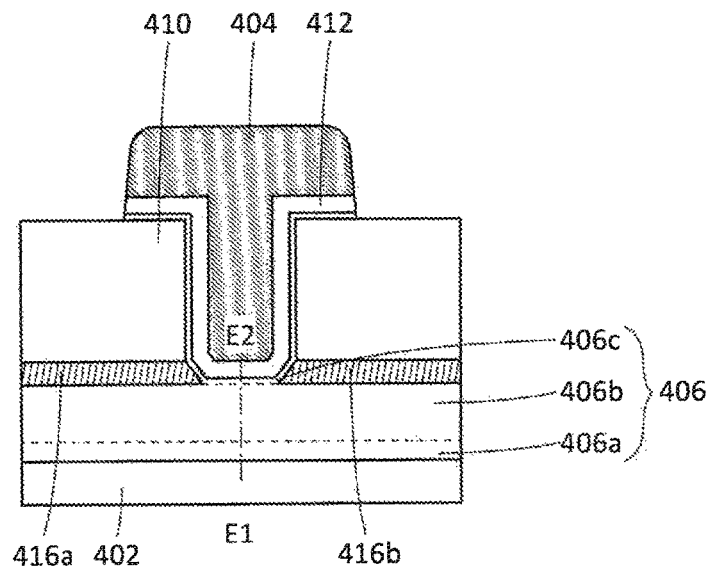
FIGS. 3A and 3B are a cross-sectional view and a band diagram of a transistor of one embodiment of the present invention.

FIG. 3A is an enlarged cross-sectional view of a part of the transistor 490. In FIG. 3A, the semiconductor 406 is a stacked-layer film in which a semiconductor layer 406a, a semiconductor layer 406b, and a semiconductor layer 406c are stacked in this order.

A semiconductor which can be used as the semiconductor layer 406a, the semiconductor layer 406b, the semiconductor layer 406c, or the like is described below.

The semiconductor layer 406b is an oxide semiconductor containing indium, for example. The semiconductor layer 406b can have high carrier mobility (electron mobility) by containing indium, for example. The semiconductor layer 406b preferably contains an element M The element M is preferably aluminum, gallium, yttrium, tin, or the like. Other elements which can be used as the element M are boron, silicon, titanium, iron, nickel, germanium, yttrium, zirconium, molybdenum, lanthanum, cerium, neodymium, hafnium, tantalum, tungsten, and the like. Note that two or more of the above elements may be used in combination as the element M. The element M is an element having a high bonding energy with oxygen, for example. The element M is an element whose bonding energy with oxygen is higher than that of indium, for example. The element M is an element that can increase the energy gap of the oxide semiconductor, for example. Furthermore, the semiconductor layer 406b preferably contains zinc. When the oxide semiconductor contains zinc, the oxide semiconductor is easily to be crystallized in some cases.

Note that the semiconductor layer 406b is not limited to the oxide semiconductor containing indium. The semiconductor layer 406b may be, for example, an oxide semiconductor which does not contain indium and contains zinc, an oxide semiconductor which does not contain indium and contains gallium, or an oxide semiconductor which does not contain indium and contains tin, e.g., a zinc tin oxide, a gallium tin oxide, or gallium oxide.

For the semiconductor layer 406b, an oxide with a wide energy gap may be used. For example, the energy gap of the semiconductor layer 406b is greater than or equal to 2.5 eV and less than or equal to 4.2 eV, preferably greater than or equal to 2.8 eV and less than or equal to 3.8 eV, or further preferably greater than or equal to 3 eV and less than or equal to 3.5 eV.

For example, the semiconductor layer 406a and the semiconductor layer 406c include one or more elements other than oxygen included in the semiconductor layer 406b. Since the semiconductor layer 406a and the semiconductor layer 406c each include one or more elements other than oxygen included in the semiconductor layer 406b, an interface state is less likely to be formed at the interface between the semiconductor layer 406a and the semiconductor layer 406b and the interface between the semiconductor layer 406b and the semiconductor layer 406c.

The case where the semiconductor layer 406a, the semiconductor layer 406b, and the semiconductor layer 406c each include indium is described below. In the case of using an In-M-Zn oxide as the oxide semiconductor layer 406a, assuming that a summation of In and M is 100 atomic %, the proportions of In and M are preferably set to be less than 50 atomic % and greater than or equal to 50 atomic %, respectively, and are further preferably set to less than 25 atomic % and greater than or equal to 75 atomic %, respectively. In the case of using an In-M-Zn oxide as the oxide semiconductor layer 406b, assuming that a summation of In and M is 100 atomic %, the proportions of In and M are preferably set to be greater than or equal to 25 atomic % and less than 75 atomic %, respectively, further preferably greater than or equal to 34 atomic % and less than 66 atomic %, respectively. In the case of using an In-M-Zn oxide as the oxide semiconductor layer 406c, assuming that a summation of In and M is 100 atomic %, the proportions of In and M are preferably set to be less than 50 atomic % and greater than or equal to 50 atomic %, respectively, further preferably less than 25 atomic % and greater than or equal to 75 atomic %, respectively. Note that the semiconductor layer 406c may be an oxide that is a type the same as that of the semiconductor layer 406a.

As the semiconductor layer 406b, an oxide having an electron affinity higher than those of the semiconductor layers 406a and 406c is used. For example, as the semiconductor layer 406b, an oxide having an electron affinity higher than those of the semiconductor layers 406a and 406c by 0.07 eV or higher and 1.3 eV or lower, preferably 0.1 eV or higher and 0.7 eV or lower, or further preferably 0.15 eV or higher and 0.4 eV or lower is used. Note that the electron affinity refers to an energy gap between the vacuum level and the bottom of the conduction band.

An indium gallium oxide has a small electron affinity and a high oxygen-blocking property. Therefore, the semiconductor layer 406c preferably includes indium gallium oxide. The gallium atomic ratio [Ga/(In+Ga)] is, for example, higher than or equal to 70%, preferably higher than or equal to 80%, or more preferably higher than or equal to 90%.

Note that the semiconductor layer 406a and/or the semiconductor layer 406c may be gallium oxide. For example, when gallium oxide is used for the semiconductor layer 406c, a leakage current generated between the conductor 404 and the conductor 416a or 416b can be reduced. In other words, the off-state current of the transistor 490 can be reduced.

At this time, when a gate voltage is applied, a channel is formed in the semiconductor layer 406b having the highest electron affinity among the semiconductor layer 406a, the semiconductor layer 406b, and the semiconductor layer 406c.

Figure 3B:
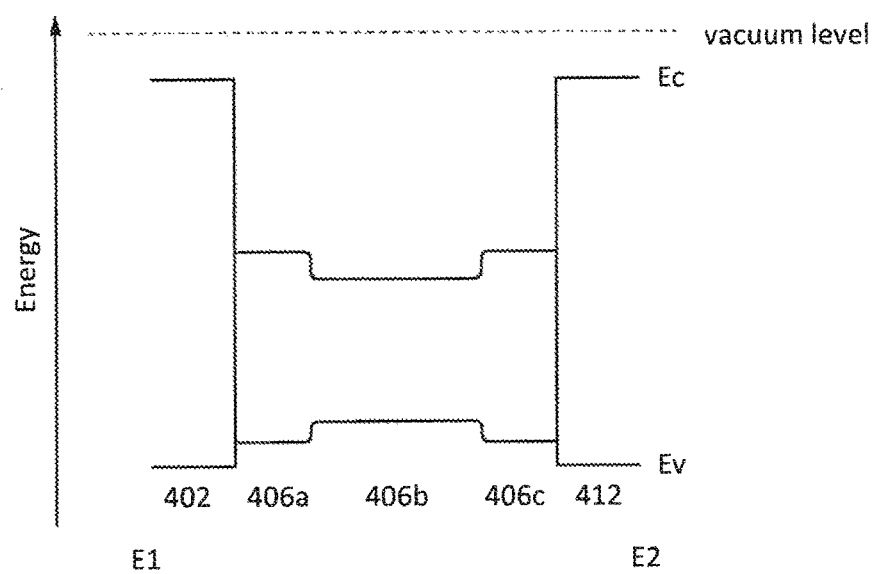

FIG. 3B is a band diagram taken along dashed-dotted line E1-E2 in FIG. 3A. FIG. 3B shows a vacuum level (denoted by vacuum level), and an energy of the bottom of the conduction band (denoted by Ec) and an energy of the top of the valence band (denoted by Ev) of each of the layers.

Here, in some cases, there is a mixed region of the semiconductor layer 406a and the semiconductor layer 406b between the semiconductor layer 406a and the semiconductor layer 406b. Furthermore, in some cases, there is a mixed region of the semiconductor layer 406b and the semiconductor layer 406c between the semiconductor layer 406b and the semiconductor layer 406c. The mixed region has a low density of interface states. For that reason, the stack of the semiconductor layer 406a, the semiconductor layer 406b, and the semiconductor layer 406c has a band structure where energy at each interface and in the vicinity of the interface is changed continuously (continuous junction).

At this time, electrons move mainly in the semiconductor layer 406b, not in the semiconductor layers 406a and 406c. Thus, when the interface state density at the interface between the semiconductor layer 406a and the semiconductor layer 406b and the interface state density at the interface between the semiconductor layer 406b and the semiconductor layer 406c are decreased, electron movement in the semiconductor layer 406b is less likely to be inhibited and the on-sate current of the transistor 490 can be increased.

In the case where the transistor 490 has an s-channel structure, a channel is formed in the whole of the semiconductor layer 406b. Therefore, as the semiconductor layer

406b has a larger thickness, a channel region becomes larger. In other words, the thicker the semiconductor layer 406b is, the larger the on-state current of the transistor 490 is. For example, the semiconductor layer 406b has a region with a thickness of greater than or equal to 20 nm, preferably greater than or equal to 40 nm, more preferably greater than or equal to 60 nm, or still more preferably greater than or equal to 100 nm. Note that the semiconductor layer 406b has a region with a thickness of, for example, less than or equal to 300 nm, preferably less than or equal to 200 nm, or more preferably less than or equal to 150 nm because the productivity of the semiconductor device including the transistor 490 might be decreased.

Moreover, the thickness of the semiconductor layer 406c is preferably as small as possible to increase the on-state current of the transistor 490. The semiconductor layer 406c has a region with a thickness of less than 10 nm, preferably less than or equal to 5 nm, more preferably less than or equal to 3 nm, for example. Meanwhile, the semiconductor layer 406c has a function of blocking elements other than oxygen (such as hydrogen and silicon) included in the adjacent insulator from entering the semiconductor layer 406b where a channel is formed. For this reason, it is preferable that the oxide semiconductor layer 406c have a certain thickness. The semiconductor layer 406c has a region with a thickness of greater than or equal to 0.3 nm, preferably greater than or equal to 1 nm, more preferably greater than or equal to 2 nm, for example. The semiconductor layer 406c preferably has an oxygen blocking property to suppress outward diffusion of oxygen released from the insulator 402 and the like.

To improve reliability, preferably, the thickness of the semiconductor layer 406a is large and the thickness of the semiconductor layer 406c is small. For example, the semiconductor layer 406a has a region with a thickness of, for example, greater than or equal to 10 nm, preferably greater than or equal to 20 nm, more preferably greater than or equal to 40 nm, still more preferably greater than or equal to 60 nm. When the thickness of the semiconductor layer 406a is made large, a distance from an interface between the adjacent insulator and the semiconductor layer 406a to the semiconductor layer 406b in which a channel is formed can be large. Since the productivity of the semiconductor device including the transistor 490 might be decreased, the semiconductor layer 406a has a region with a thickness, for example, less than or equal to 200 nm, preferably less than or equal to 120 nm, or further preferably less than or equal to 80 nm.

Silicon in the oxide semiconductor might serve as a carrier trap or a carrier generation source, for example. Therefore, the silicon concentration in the semiconductor layer 406b is preferably as low as possible. For example, a region with the silicon concentration of lower than $1\times10^{19}$ atoms/cm$^3$, preferably lower than $5\times10^{18}$ atoms/cm$^3$, or further preferably lower than $2\times10^{18}$ atoms/cm$^3$ which is measured by secondary ion mass spectrometry (SIMS) is provided between the semiconductor layer 406b and the semiconductor layer 406a. A region with the silicon concentration of lower than $1\times10^{19}$ atoms/cm$^3$, preferably lower than $5\times10^{18}$ atoms/cm$^3$, more preferably lower than $2\times10^{18}$ atoms/cm$^3$ which is measured by SIMS is provided between the semiconductor layer 406b and the semiconductor layer 406c.

The semiconductor layer 406b has a region in which the concentration of hydrogen which is measured by SIMS is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, or still further preferably lower than or equal to $5\times10^{18}$ atoms/cm$^3$. It is preferable to reduce the concentration of hydrogen in the semiconductor layer 406a and the semiconductor layer 406c in order to reduce the concentration of hydrogen in the semiconductor layer 406b. The semiconductor layer 406a and the semiconductor layer 406c each have a region in which the concentration of hydrogen measured by SIMS is lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, still more preferably lower than or equal to $5\times10^{18}$ atoms/cm$^3$. It is preferable to reduce the concentration of nitrogen in the semiconductor layer 406a and the semiconductor layer 406c in order to reduce the concentration of nitrogen in the semiconductor layer 406b. The semiconductor layer 406b has a region in which the concentration of nitrogen measured by SIMS is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$. The semiconductor layers 406a and 406c each have a region in which the concentration of nitrogen measured by SIMS is lower than $5\times10^{19}$ atoms/cm$^3$, preferably less than or equal to $5\times10^{18}$ atoms/cm$^3$, more preferably less than or equal to $1\times10^{18}$ atoms/cm$^3$, still more preferably less than or equal to $5\times10^{17}$ atoms/cm$^3$.

Note that when copper enters the oxide semiconductor, an electron trap might be generated. The electron trap might shift the threshold voltage of the transistor in the positive direction. Therefore, the concentration of copper on the surface of or in the semiconductor layer 406b is preferably as low as possible. For example, the semiconductor layer 406b preferably has a region in which the concentration of copper is lower than or equal to $1\times10^{19}$ atoms/cm$^3$, lower than or equal to $5\times10^{18}$ atoms/cm$^3$, or lower than or equal to $1\times10^{18}$ atoms/cm$^3$.

The above three-layer structure is an example. For example, a two-layer structure without the semiconductor layer 406a or the semiconductor layer 406c may be employed. A four-layer structure in which any one of the semiconductors described as examples of the semiconductor layer 406a, the semiconductor layer 406b, and the semiconductor layer 406c is provided below or over the semiconductor layer 406a or below or over the semiconductor layer 406c may be employed. An n-layer structure (n is an integer of 5 or more) in which any one of the semiconductors described as examples of the semiconductor layer 406a, the semiconductor layer 406b, and the semiconductor layer 406c is provided at two or more of the following positions: over the semiconductor layer 406a, below the semiconductor layer 406a, over the semiconductor layer 406c, and below the semiconductor layer 406c.

As the substrate 400, an insulator substrate, a semiconductor substrate, or a conductor substrate may be used, for example. As the insulator substrate, a glass substrate, a quartz substrate, a sapphire substrate, a stabilized zirconia substrate (e.g., an yttria-stabilized zirconia substrate), or a resin substrate is used, for example. As the semiconductor substrate, a single material semiconductor substrate of silicon, germanium, or the like or a compound semiconductor substrate of silicon carbide, silicon germanium, gallium arsenide, indium phosphide, zinc oxide, gallium oxide, or the like is used, for example. A semiconductor substrate in which an insulator region is provided in the above semiconductor substrate, e.g., a silicon on insulator (SOI) substrate or the like is used. As the conductor substrate, a graphite substrate, a metal substrate, an alloy substrate, a conductive resin substrate, or the like is used. A substrate including a metal nitride, a substrate including a metal oxide, or the like is used. An insulator substrate provided with a conductor or a semiconductor, a semiconductor substrate provided with a conductor or an insulator, a conductor substrate provided with a semiconductor or an insulator, or the like is used. Alternatively, any of these substrates over which an element is provided may be used. As the element provided over the substrate, a capacitor, a resistor, a switching element, a light-emitting element, a memory element, or the like is used.

Alternatively, a flexible substrate may be used as the substrate 400. As a method for providing the transistor over a flexible substrate, there is a method in which the transistor is formed over a non-flexible substrate and then the transistor is separated and transferred to the substrate 400 which is a flexible substrate. In that case, a separation layer is preferably provided between the non-flexible substrate and the transistor. As the substrate 400, a sheet, a film, or a foil containing a fiber may be used. The substrate 400 may have elasticity. The substrate 400 may have a property of returning to its original shape when bending or pulling is stopped. Alternatively, the substrate 400 may have a property of not returning to its original shape. The substrate 400 has a region with a thickness of, for example, greater than or equal to 5 μm and less than or equal to 700 μm, preferably greater than or equal to 10 μm and less than or equal to 500 μm, more preferably greater than or equal to 15 μm and less than or equal to 300 μm. When the substrate 400 has a small thickness, the weight of the semiconductor device including the transistor 490 can be reduced. When the substrate 400 has a small thickness, even in the case of using glass or the like, the substrate 400 may have elasticity or a property of returning to its original shape when bending or pulling is stopped. Therefore, an impact applied to the semiconductor device over the substrate 400, which is caused by dropping or the like, can be reduced. That is, a durable semiconductor device can be provided.

For the substrate 400 which is a flexible substrate, metal, an alloy, resin, glass, or fiber thereof can be used, for example. The flexible substrate 400 preferably has a lower coefficient of linear expansion because deformation due to an environment is suppressed. The flexible substrate 400 is formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, and acrylic. In particular, aramid is preferably used for the flexible substrate 400 because of its low coefficient of linear expansion.

Figure 4A:
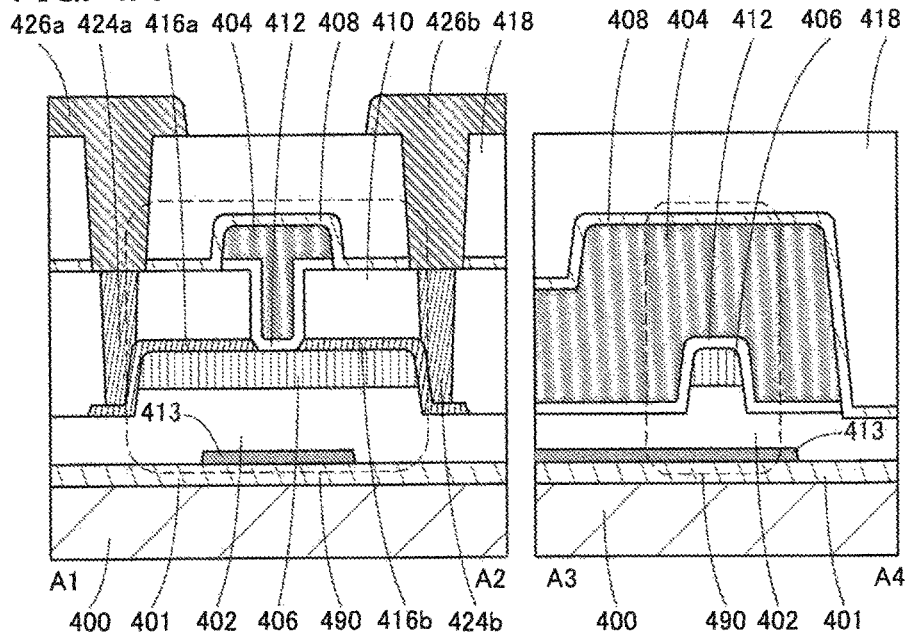
FIGS. 4A and 4B are cross-sectional views each illustrating a transistor of one embodiment of the present invention.
Figure 4B:
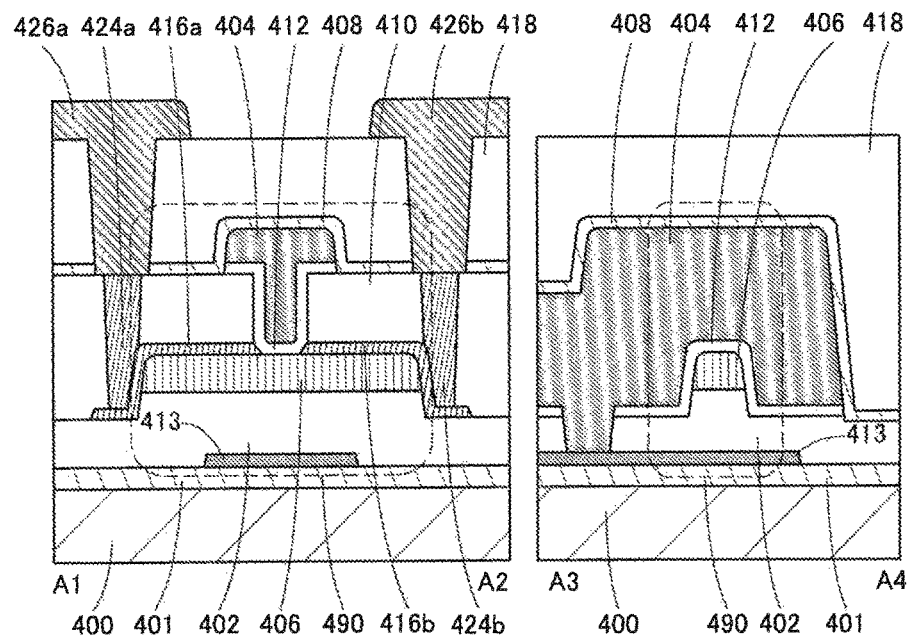

Note that the transistor 490 may have a cross-sectional structure shown in FIG. 4A or 4B. The structure in FIG. 4A is different from that in FIG. 1B in that a conductor 413 is provided under the insulator 402. The structure in FIG. 4B is different from that in FIG. 4A in that the conductor 413 is electrically connected to the conductor 404.

The conductor 413 serves as a second gate electrode (also referred to as a back gate electrode) of the transistor 490. For example, by applying a lower voltage or a higher voltage than a source electrode to the conductor 413, the threshold voltage of the transistor 490 may be shifted in the positive direction or the negative direction. For example, by shifting the threshold voltage of the transistor 490 in the positive direction, a normally-off transistor in which the transistor 490 is in a non-conduction state (off state) even when the gate voltage is 0 V can be achieved in some cases. The voltage applied to the conductor 413 may be variable or fixed.

The conductor 413 may have a single-layer structure or a stacked-layer structure using a conductor containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten, for example. An alloy or a compound may be used, for example, and a conductor containing aluminum, a conductor containing copper and titanium, a conductor containing copper and manganese, a conductor containing indium, tin, and oxygen, a conductor containing titanium and nitrogen, or the like may be used.

<Manufacturing Method of Transistor Structure 1>

A method for manufacturing the transistor 490 illustrated in FIGS. 1A and 1B is described below.

First, the substrate 400 is prepared.

Next, the insulator 401 is formed. The insulator 401 may be formed by a sputtering method, a chemical vapor deposition (CVD) method, a molecular beam epitaxy (MBE) method, a pulsed laser deposition (PLD) method, an atomic layer deposition (ALD) method, or the like.

A CVD method includes a plasma enhanced CVD (PECVD) method using plasma, a thermal CVD (TCVD) method using heat, a photo CVD method using light, and the like. Moreover, the CVD method can be classified into a metal CVD (MCVD) method and a metal organic CVD (MOCVD) method depending on a source gas.

By using the PECVD method, a high-quality film can be formed at a relatively low temperature. The thermal CVD method, which does not use plasma, is a film formation method with less plasma damage to an object of the treatment. For example, a wiring, an electrode, an element (e.g., a transistor or a capacitor), and the like included in a semiconductor device may receive charges from plasma, and charge buildup may occur in some cases. In that case, because of the accumulated charges, the wiring, the electrode, the element, or the like in the semiconductor device may be broken. Such plasma damage is small in the case of using the thermal CVD method, and thus the yield of a semiconductor device can be increased. In addition, since plasma damage is small in the film formation by the thermal CVD method, a film with few defects can be obtained.

In addition, the ALD method is also a film formation method with less plasma damage to an object of the treatment. By using the ALD method, a film with few defects can be obtained since the plasma damage is small.

Different from a film formation method whereby particles released from a target are deposited, the CVD method and the ALD method are film formation methods whereby a film is formed by a reaction at a surface of an object of the treatment. Therefore, they are film formation methods whereby a film with favorable coverage is formed without being greatly affected by the shape of the object. In particular, a film formed by the ALD method has favorable coverage and excellent uniformity in thickness. Therefore, the ALD method is preferred for forming a film covering a surface of an opening with a high aspect ratio. However, film formation speed of the ALD method is relatively slow, and thus it may be preferable to use the ALD method in combination with another film formation method with high film formation speed such as the CVD method in some cases.

In the case of the CVD method or the ALD method, the composition of a film to be obtained can be controlled by adjusting the flow ratio of a source gas. For example, by the CVD method or the ALD method, a film with a desired composition can be formed by adjusting the flow ratio of a source gas. Moreover, with the CVD method or the ALD method, by changing the flow ratio of the source gases while forming the film, a film whose composition is continuously changed can be formed. In the case where the film is formed while changing the flow ratio of the source gases, as compared to the case where the film is formed using a plurality of deposition chambers, time taken for the film formation can be reduced because time taken for transfer and pressure adjustment is omitted. Thus, semiconductor devices can be manufactured with improved productivity.

Figure 5A:
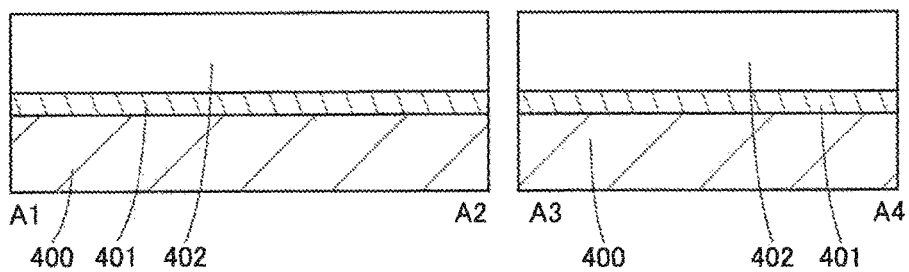
FIGS. 5A and 5B are cross-sectional views illustrating a method for manufacturing a transistor of one embodiment of the present invention.

Next, the insulator 402 is formed (FIG. 5A). The insulator 402 can be formed by the sputtering method, the CVD method, the MBE method, the PLD method, the ALD method, or the like.

Next, treatment to add oxygen to the insulator 402 may be performed. An ion implantation method, a plasma treatment method, or the like can be used for the treatment to add oxygen. Note that oxygen added to the insulator 402 is excess oxygen.

Next, a semiconductor is formed. The semiconductor can be formed by the sputtering method, the CVD method, the MBE method, the PLD method, the ALD method, or the like.

Next, treatment to add oxygen to the semiconductor may be performed. An ion implantation method, a plasma treatment method, or the like can be used for the treatment to add oxygen. Note that oxygen added to the semiconductor becomes excess oxygen. When the semiconductor is a stacked-layer film, oxygen is preferably added to a layer of the semiconductor to be the semiconductor layer 406a in FIG. 3A.

Next, first heat treatment is preferably performed. The first heat treatment may be performed at higher than or equal to 250° C. and lower than or equal to 650° C., preferably higher than or equal to 450° C. and lower than or equal to 600° C., more preferably higher than or equal to 520° C. and lower than or equal to 570° C. The first heat treatment is performed in an inert gas atmosphere or an atmosphere containing an oxidizing gas at 10 ppm or more, 1% or more, or 10% or more. The first heat treatment may be performed under a reduced pressure. Alternatively, the first heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. By the first heat treatment, crystallinity of the semiconductor can be increased and impurities such as hydrogen and moisture can be removed, for example.

Figure 5B:
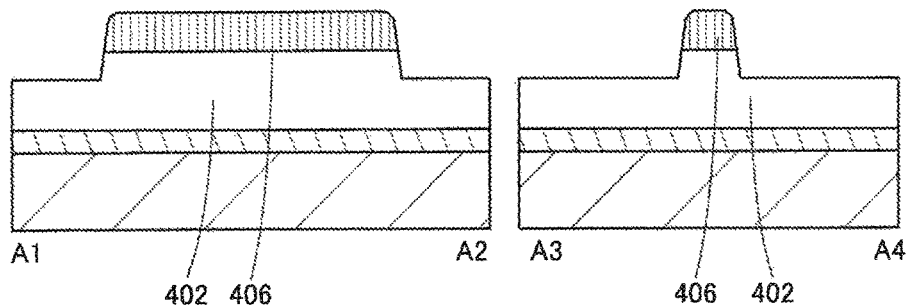

Next, the semiconductor is processed by a photolithography method or the like, so that the semiconductor 406 is formed (FIG. 5B). Note that when the semiconductor 406 is formed, part of the insulator 402 may be etched and thinned in some cases. That is, the insulator 402 may have a protruding portion in a region in contact with the semiconductor 406.

Next, a conductor is formed. The conductor can be formed by the sputtering method, the CVD method, the MBE method, the PLD method, the ALD method, or the like.

Figure 6A:
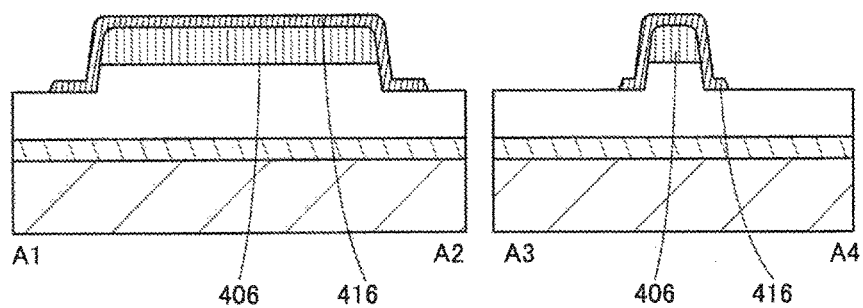
FIGS. 6A and 6B are cross-sectional views illustrating a method for manufacturing a transistor of one embodiment of the present invention.

Next, the conductor is processed by the photolithography method or the like, so that a conductor 416 is formed (FIG. 6A). Note that the conductor 416 covers the semiconductor 406.

In the photolithography method, first, a resist is exposed to light through a photomask. Next, a region exposed to light is removed or left using a developing solution, so that a resist mask is formed. Then, etching through the resist mask is conducted. As a result, a conductor, a semiconductor, an insulator, or the like can be processed into a desired shape. The resist mask is formed by, for example, exposure of the resist to light using KrF excimer laser light, ArF excimer laser light, extreme ultraviolet (EUV) light, or the like. Alternatively, a liquid immersion technique may be employed in which a portion between a substrate and a projection lens is filled with liquid (e.g., water) to perform light exposure. An electron beam or an ion beam may be used instead of the above-mentioned light. Note that a photomask is not necessary in the case of using an electron beam or an ion beam. Note that dry etching treatment such as ashing and/or wet etching treatment can be used for removal of the resist mask.

Figure 6B:
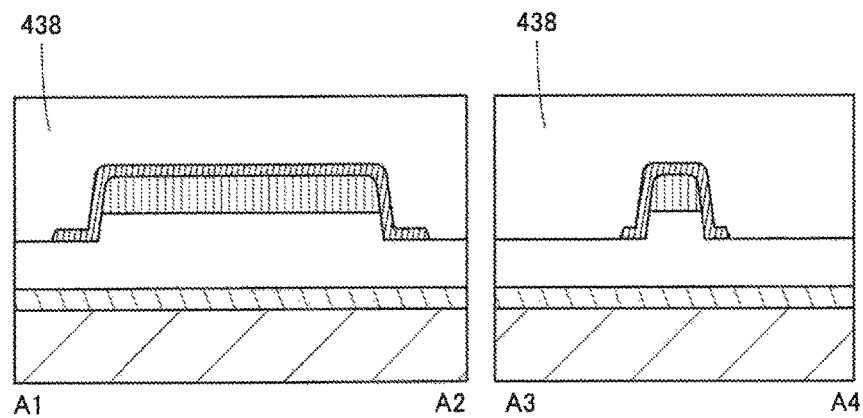

Next, an insulator 438 is formed (FIG. 6B). The insulator 438 can be formed by the sputtering method, the CVD method, the MBE method, the PLD method, the ALD method, or the like. Alternatively, the insulator 438 can be formed by a spin coating method, a dipping method, a droplet discharging method (such as an ink-jet method), a printing method (such as screen printing or offset printing), a doctor knife method, a roll coater method, a curtain coater method, or the like.

The insulator 438 is formed to have a flat top surface. For example, the top surface of the insulator 438 may have planarity immediately after the film formation. Alternatively, after the film formation, an upper portion of the insulator 438 may be removed so that the top surface of the insulator 438 becomes parallel to a reference surface such as a rear surface of the substrate. Such treatment is referred to as planarization treatment. As the planarization treatment, for example, chemical mechanical polishing (CMP) treatment, dry etching treatment, or the like can be performed. However, the top surface of the insulator 438 is not necessarily flat.

Next, the insulator 438 is processed by the photolithography method or the like, so that an insulator 439 with an opening reaching a portion to be the conductor 416a and an opening reaching a portion to be the conductor 416b is formed.

Next, a conductor is formed. The conductor can be formed by the sputtering method, the CVD method, the MBE method, the PLD method, the ALD method, or the like. The conductor is formed so as to fill the openings in the insulator 439. Therefore, the CVD method (the MCVD method, in particular) is preferred. A stacked-layer film of a conductor formed by the ALD method or the like and a conductor formed by the CVD method is preferred in some cases to increase adhesion of the conductor formed by the CVD method. For example, a stacked-layer film where titanium nitride and tungsten are formed in this order may be used.

Next, planarizing parallel to the reference surface such as the rear surface of the substrate, the treatment for removing an upper portion of the conductor is performed until only the conductors in the openings in the insulator 439 are left. As a result, only top surfaces of the conductors in the openings in the insulator 439 are exposed. At this time, the conductors in the openings in the insulator 439 are referred to as the conductors 424a and 424b (FIG. 7A).

Next, the insulator 439 is processed by the photolithography method or the like, so that the insulator 410 is formed.

Next, the conductor 416 is processed by the photolithography method or the like, so that the conductors 416a and 416b are formed (FIG. 7B). Note that the insulator 439 and the conductor 416 may be processed in the same photolithography process. Processing in the same photolithography process can reduce the number of manufacturing steps. Thus, productivity of a semiconductor device including the transistor 490 can be increased. Alternatively, the insulator 439 and the conductor 416 may be processed in different photolithography processes. Processing in different photolithography processes may facilitate formation of films with different shapes.

Here, the semiconductor 406 is exposed.

Next, an insulator is formed. The insulator can be formed by the sputtering method, the CVD method, the MBE method, the PLD method, the ALD method, or the like. The insulator is formed to have the uniform thickness along bottom and side surfaces of an opening formed in the insulator 410 and the conductors 416a and 416b. Therefore, the ALD method is preferably used.

Next, a conductor is formed. The conductor can be formed by the sputtering method, the CVD method, the MBE method, the PLD method, the ALD method, or the like. The conductor is formed so as to fill the opening in the insulator 410 and others. Therefore, the CVD method (the MCVD method, in particular) is preferably used. A stacked-layer film of a conductor formed by the ALD method or the like and a conductor formed by the CVD method is preferred in some cases to increase adhesion of the conductor formed by the CVD method. For example, the stacked-layer film where titanium nitride and tungsten are formed in this order may be used.

Next, the conductor is processed by the photolithography method or the like, so that the conductor 404 is formed.

Figure 8A:
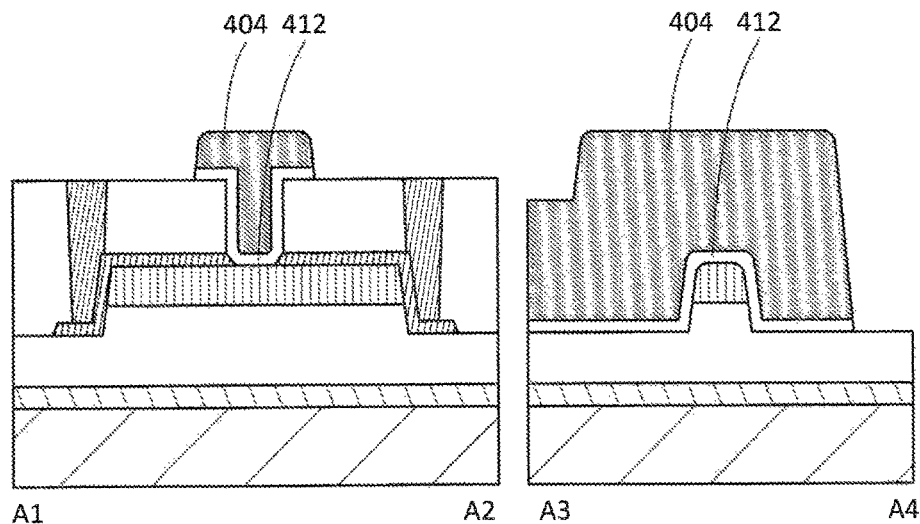
FIGS. 8A and 8B are cross-sectional views illustrating a method for manufacturing a transistor of one embodiment of the present invention.

Next, the insulator is processed by the photolithography method or the like, so that the insulator 412 is formed (FIG. 8A). Note that the conductor and the insulator may be processed in the same photolithography step. Processing in the same photolithography process can reduce the number of manufacturing steps. Thus, productivity of a semiconductor device including the transistor 490 can be increased. Alternatively, the conductor and the insulator may be processed in different photolithography processes. Processing in different photolithography processes may facilitate formation of films with different shapes. Though an example where the insulator is processed into the insulator 412 is shown here, the transistor of one embodiment of the present invention is not limited thereto. For example, the insulator without processing may be used as the insulator 412 in some cases.

Next, an insulator to be the insulator 408 is formed. The insulator to be the insulator 408 can be formed by the sputtering method, the CVD method, the MBE method, the PLD method, the ALD method, or the like.

Second heat treatment may be performed at any time after the formation of the insulator to be the insulator 408. Excess oxygen included in the insulator 402 and the like moves into the semiconductor 406 by performing the second heat treatment, whereby defects (oxygen vacancies) in the semiconductor 406 can be reduced. Note that the second heat treatment may be performed at a temperature such that excess oxygen (oxygen) in the insulator 402 is diffused to the semiconductor 406. For example, the description of the first heat treatment may be referred to for the second heat treatment. Alternatively, the temperature of the second heat treatment is preferably lower than that of the first heat treatment. A temperature difference between the first heat treatment and the second heat treatment is to be 20° C. or more and 150° C. or less, preferably 40° C. or more and 100° C. or less. Accordingly, superfluous release of excess oxygen (oxygen) from the insulator 402 can be inhibited. Note that the second heat treatment is not necessarily performed when heating during formation of the films can work as heat treatment comparable to the second heat treatment.

Next, an insulator to be the insulator 418 is formed. The insulator to be the insulator 418 can be formed by the sputtering method, the CVD method, the MBE method, the PLD method, the ALD method, or the like.

Next, the insulator to be the insulator 418 is processed by the photolithography method or the like, so that the insulator 418 is formed.

Next, the insulator to be the insulator 408 is processed by the photolithography method or the like, so that the insulator 408 is formed. Note that the insulators to be the insulators 418 and 408 may be processed in the same photolithography process. Processing in the same photolithography process can reduce the number of manufacturing steps. Thus, productivity of a semiconductor device including the transistor 490 can be increased. Alternatively, the insulator to be the insulator 418 and the insulator to be the insulator 408 may be processed in different photolithography processes. Processing in different photolithography processes may facilitate formation of films with different shapes.

At this time, the conductors 424a and 424b are exposed.

Next, a conductor is formed. The conductor can be formed by the sputtering method, the CVD method, the MBE method, the PLD method, the ALD method, or the like.

Figure 8B:
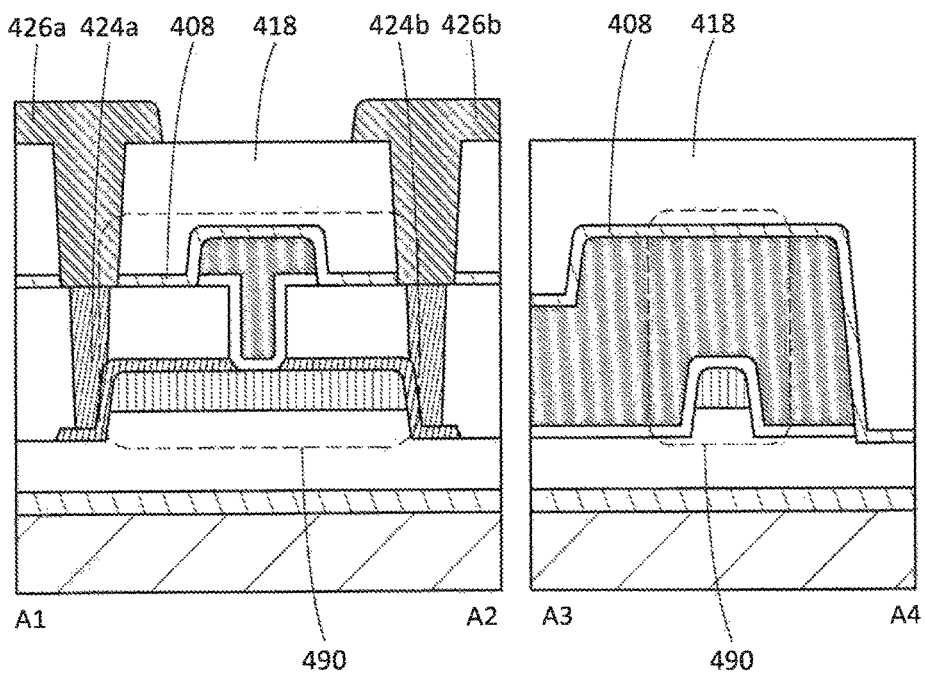

Next, the conductor is processed by the photolithography method or the like, so that the conductors 426a and 426b are formed (FIG. 8B).

Through the above steps, the transistor 490 illustrated in FIGS. 1A and 1B can be manufactured.

In the transistor 490, the size or the like of the offset region or the overlap region can be controlled by the thicknesses, shapes, or the like of the films. Therefore, the size or the like of the offset region or the overlap region can be smaller than a minimum feature size by the photolithography method; thus, the transistor can be easily miniaturized. In addition, since the parasitic capacitance is small, the transistor can have high frequency characteristics.

<Transistor Structure 2>

Figure 9A:
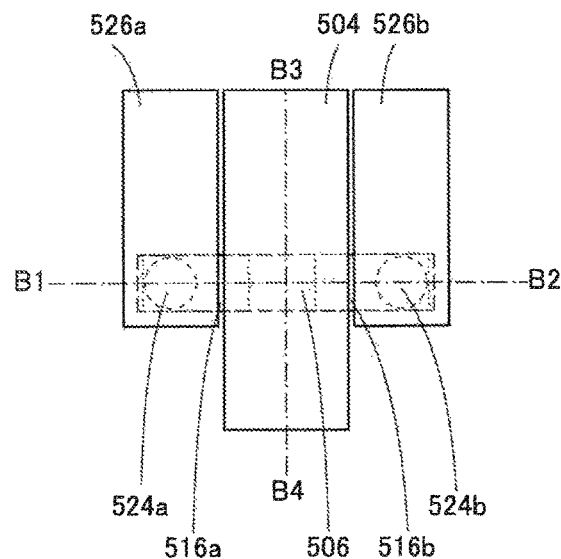
FIGS. 9A and 9B are a top view and a cross-sectional view illustrating a method for manufacturing a transistor of one embodiment of the present invention.
Figure 9B:
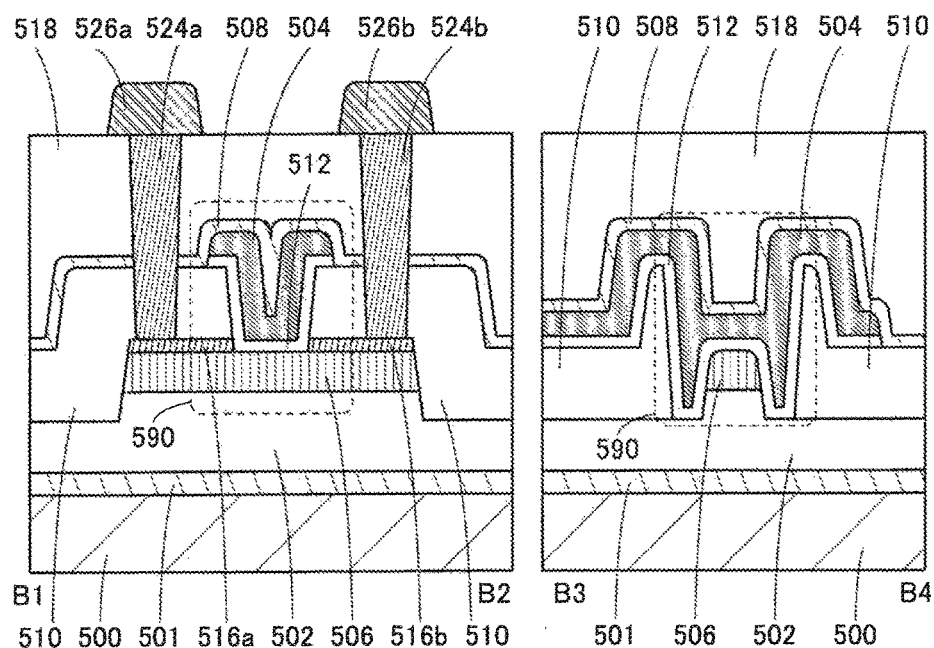

A transistor 590, which has a different structure from the transistor 490 in FIGS. 1A and 1B and the like, is described below. FIGS. 9A and 9B are a top view and a cross-sectional view of the transistor 590 of one embodiment of the present invention. FIG. 9A is a top view. FIG. 9B is a cross-sectional view taken along dashed-dotted line B1-B2 and dashed-dotted line B3-B4 in FIG. 9A. Note that for simplification of the drawing, some components are not illustrated in the top view in FIG. 9A.

In FIG. 9B, the transistor 590 includes an insulator 501 over a substrate 500, an insulator 502 over the insulator 501, a semiconductor 506 over the insulator 502, conductors 516a and 516b each include a region in contact with a top surface of the semiconductor 506, an insulator 510 that is in contact with top surfaces of the conductors 516a and 516b, an insulator 512 in contact with the top surface of the semiconductor 506, a conductor 504 over the semiconductor 506 with the insulator 512 provided therebetween, and an insulator 508 over the insulator 510 and the conductor 504.

Note that the transistor 590 does not necessarily include the insulator 501 in some cases. Note that the transistor 590 does not necessarily include the insulator 502 in some cases. Note that the transistor 590 does not necessarily include the insulator 508 in some cases.

In FIG. 9B, an insulator 518 is over the insulator 508 of the transistor 590. The insulators 518, 508, and 510 have an opening reaching the conductor 516a and another opening reaching the conductor 516b. In addition, the transistor 590 includes a conductor 524a and a conductor 524b in contact with the conductor 516a and the conductor 516b, respectively, through the openings in the insulators 518, 508, and 510; a conductor 526a in contact with the conductor 524a; and a conductor 526b in contact with the conductor 524b.

In the transistor 590, the conductor 504 serves as a gate electrode. The insulator 512 serves as a gate insulator. The conductor 516a and the conductor 516b serve as a source electrode and a drain electrode. Therefore, resistance of the semiconductor 506 can be controlled by a potential applied to the conductor 504. That is, conduction or non-conduction between the conductors 516a and 516b can be controlled by the potential applied to the conductor 504.

In the transistor 590, the conductor 504 includes a region overlapping with the conductor 516a with the insulator 510 provided therebetween, and a region overlapping with the conductor 516b with the insulator 510 provided therebetween. The transistor 590 includes the insulator 510 between the conductor 504 and the conductor 516a, and between the conductor 504 and the conductor 516b, whereby parasitic capacitance can be reduced. Thus, the transistor 590 has high frequency characteristics.

As shown in FIG. 9B, the semiconductor 506 is electrically surrounded by an electric field of the conductor 504. That is, the transistor 590 has an s-channel structure. Therefore, the on-state current of the transistor can be increased. In addition, the off-state current of the transistor can be reduced. Furthermore, because the conductors 516a and 516b are not in contact with side surfaces of the semiconductor 506, the effect caused by surrounding the semiconductor 506 with the electric field of the conductor 504 is strengthened. Thus, the transistor 590 can gain more benefits of the s-channel structure than the transistor 490.

Note that electrical characteristics of the transistor 590 can be stabilized when the transistor 590 is surrounded by an insulator with a function of blocking oxygen and impurities such as hydrogen. For example, an insulator with a function of blocking oxygen and impurities such as hydrogen may be used as the insulator 501 and the insulator 508.

For the substrate 500, the description of the substrate 400 is referred to. For the insulator 501, the description of the insulator 401 is referred to. For the insulator 502, the description of the insulator 402 is referred to. For the semiconductor 506, the description of the semiconductor 406 is referred to. For the conductor 516a, the description of the conductor 416a is referred to. For the conductor 516b, the description of the conductor 416b is referred to. For the insulator 512, the description of the insulator 412 is referred to. For the conductor 504, the description of the conductor 404 is referred to. For the insulator 508, the description of the insulator 408 is referred to. For the insulator 518, the description of the insulator 418 is referred to. For the conductor 524a, the description of the conductor 424a is referred to. For the conductor 524b, the description of the conductor 424b is referred to. For the conductor 526a, the description of the conductor 426a is referred to. For the conductor 526b, the description of the conductor 426b is referred to.

Note that the transistor 590 may have a cross-sectional structure shown in FIG. 10A or 10B. The structure in FIG. 10A is different from that in FIG. 9B in that a conductor 513 is provided under the insulator 502. The structure in FIG. 10B is different from that in FIG. 10A in that the conductor 513 is electrically connected to the conductor 504.

The conductor 513 serves as a second gate electrode (also referred to as a back gate electrode) of the transistor 590. For example, by applying a lower voltage or a higher voltage than a source electrode to the conductor 513, the threshold voltage of the transistor 590 may be shifted in the positive direction or the negative direction. For example, by shifting the threshold voltage of the transistor 590 in the positive direction, a normally-off transistor in which the transistor 590 is in a non-conduction state (off state) even when the gate voltage is 0 V can be achieved in some cases. The voltage applied to the conductor 513 may be variable or fixed.

For the conductor 513, the description of the conductor 413 is referred to.

<Manufacturing Method of Transistor Structure 2>

A method for manufacturing the transistor 590 illustrated in FIGS. 9A and 9B is described below.

First, the substrate 500 is prepared.

Next, the insulator 501 is formed. The insulator 501 can be formed by the sputtering method, the CVD method, the MBE method, the PLD method, the ALD method, or the like.

Figure 11A:
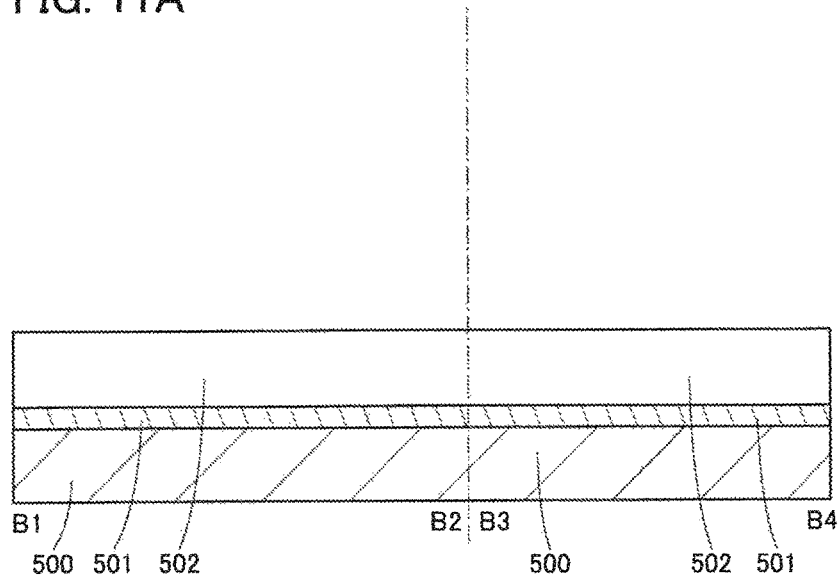
FIGS. 11A and 11B are cross-sectional views illustrating a method for manufacturing a transistor of one embodiment of the present invention.

Next, the insulator 502 is formed (FIG. 11A). The insulator 502 can be formed by the sputtering method, the CVD method, the MBE method, the PLD method, the ALD method, or the like.

Next, treatment to add oxygen to the insulator 502 may be performed. An ion implantation method, a plasma treatment method, or the like can be used for the treatment to add oxygen. Note that oxygen added to the insulator 502 is excess oxygen.

Next, a semiconductor is formed. The semiconductor can be formed by the sputtering method, the CVD method, the MBE method, the PLD method, the ALD method, or the like.

Next, treatment to add oxygen to the semiconductor may be performed. An ion implantation method, a plasma treatment method, or the like can be used for the treatment to add oxygen. Note that oxygen added to the semiconductor is excess oxygen. When the semiconductor is a stacked-layer film, oxygen is preferably added to a layer of the semiconductor to be the semiconductor layer 406a in FIG. 3A.

Next, first heat treatment is preferably performed. The first heat treatment may be performed at higher than or equal to 250° C. and lower than or equal to 650° C., preferably higher than or equal to 450° C. and lower than or equal to 600° C., more preferably higher than or equal to 520° C. and lower than or equal to 570° C. The first heat treatment is performed in an inert gas atmosphere or an atmosphere containing an oxidizing gas at 10 ppm or more, 1% or more, or 10% or more. The first heat treatment may be performed under a reduced pressure. Alternatively, the first heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. By the first heat treatment, crystallinity of the semiconductor can be increased and impurities such as hydrogen and moisture can be removed, for example.

Next, a conductor is formed. The conductor can be formed by the sputtering method, the CVD method, the MBE method, the PLD method, the ALD method, or the like.

Next, the conductor is processed by the photolithography method or the like, so that a conductor 516 is formed.

Figure 11B:
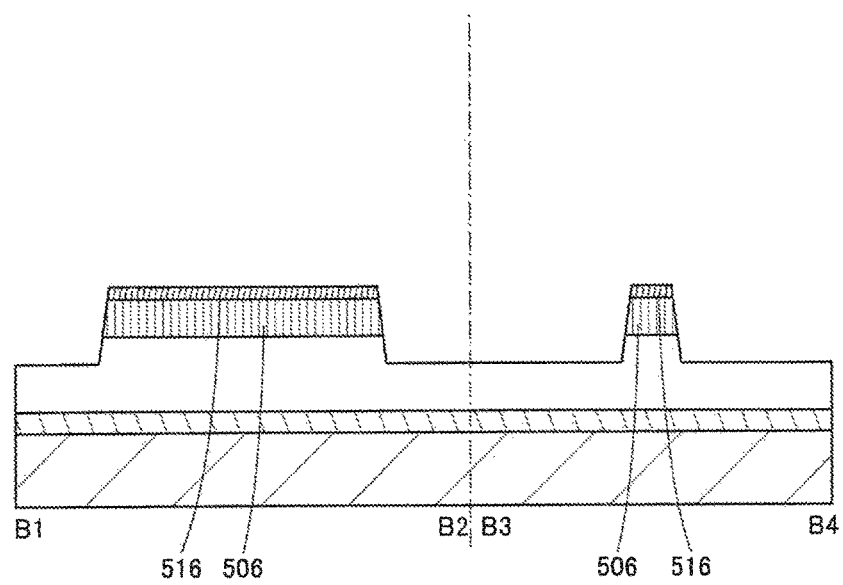

Next, the semiconductor is etched through the conductor 516, so that the semiconductor 506 is formed (FIG. 11B).

Note that when the semiconductor 506 is formed, part of the insulator 502 may be etched and thinned in some cases. That is, the insulator 502 may have a protruding portion in a region in contact with the semiconductor 506.

Figure 12A:
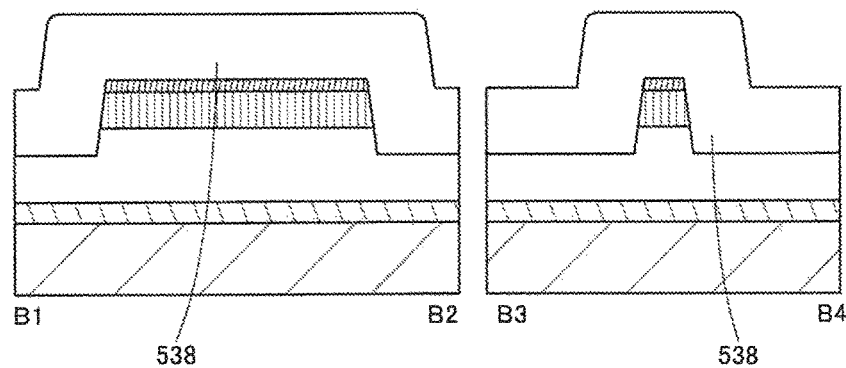
FIGS. 12A and 12B are cross-sectional views illustrating a method for manufacturing a transistor of one embodiment of the present invention.

Next, an insulator 538 is formed (FIG. 12A). The insulator 538 can be formed by the sputtering method, the CVD method, the MBE method, the PLD method, the ALD method, or the like. Alternatively, the insulator 538 can be formed by a spin coating method, a dipping method, a droplet discharging method (such as an ink-jet method), a printing method (such as screen printing or offset printing), a doctor knife method, a roll coater method, a curtain coater method, or the like.

A top surface of the insulator 538 may have planarity.

Next, the insulator 538 is processed by the photolithography method or the like, so that the insulator 539 is formed.

Figure 12B:
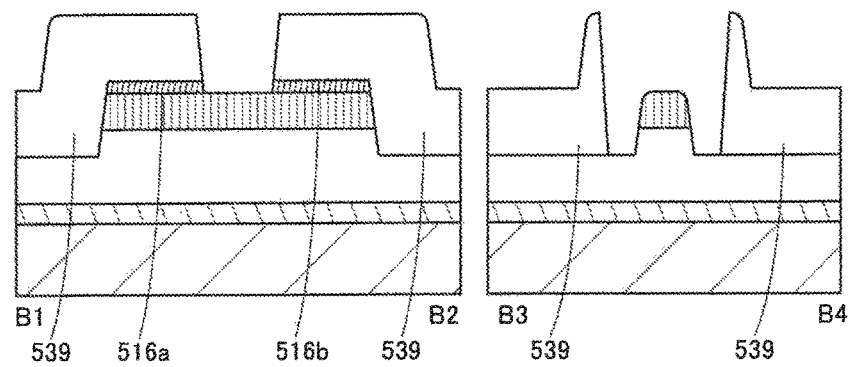

Next, the conductor 516 is processed by the photolithography method or the like, so that the conductors 516a and 516b are formed (FIG. 12B). Note that the insulator 538 and the conductor 516 may be processed in the same photolithography process. Processing in the same photolithography process can reduce the number of manufacturing steps. Thus, productivity of a semiconductor device including the transistor 590 can be increased. Alternatively, the insulator 538 and the conductor 516 may be processed in different photolithography processes. Processing in different photolithography processes may facilitate formation of films with different shapes.

Here, the semiconductor 506 is exposed.

Next, an insulator is formed. The insulator can be formed by the sputtering method, the CVD method, the MBE method, the PLD method, the ALD method, or the like. The insulator is formed to have the uniform thickness along bottom and side surfaces of an opening formed in the insulator 539 and the conductors 516a and 516b. Therefore, the ALD method is preferably used.

Next, a conductor is formed. The conductor can be formed by the sputtering method, the CVD method, the MBE method, the PLD method, the ALD method, or the like. The conductor is formed so as to fill the opening in the insulator 539 and others. Therefore, the CVD method (the MCVD method, in particular) is preferably used. A stacked-layer film of a conductor formed by the ALD method or the like and a conductor formed by the CVD method is preferred in some cases to increase adhesion of the conductor formed by the CVD method. For example, the stacked-layer film where titanium nitride and tungsten are formed in this order may be used.

Next, the conductor is processed by the photolithography method or the like, so that the conductor 504 is formed.

Figure 13A:
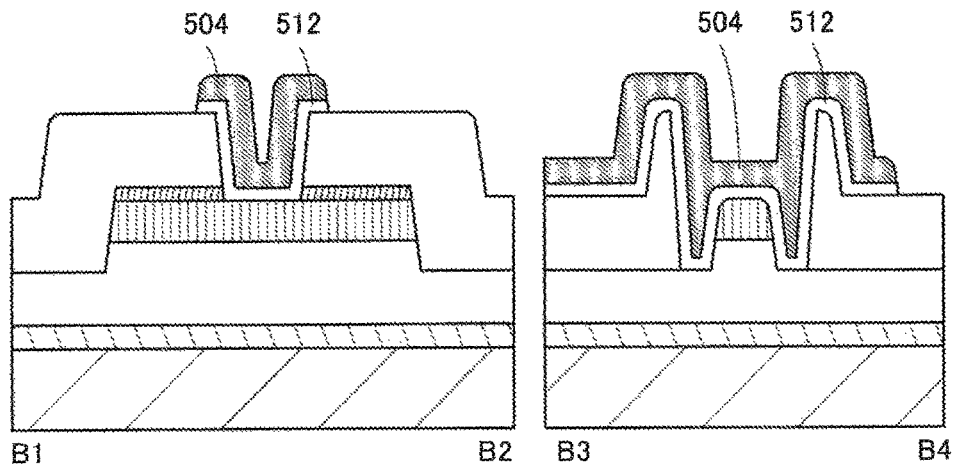
FIGS. 13A and 13B are cross-sectional views illustrating a method for manufacturing a transistor of one embodiment of the present invention.

Next, the insulator is processed by the photolithography method or the like, so that the insulator 512 is formed (FIG. 13A). Note that the conductor and the insulator may be processed in the same photolithography process. Processing in the same photolithography process can reduce the number of manufacturing steps. Thus, productivity of a semiconductor device including the transistor 590 can be increased. Alternatively, the conductor and the insulator may be processed in different photolithography processes. Processing in different photolithography processes may facilitate formation of films with different shapes. Though an example where the insulator is processed into the insulator 512 is shown here, the transistor of one embodiment of the present invention is not limited thereto. For example, the insulator without processing may be used as the insulator 512 in some cases.

Next, an insulator to be the insulator 508 is formed. The insulator to be the insulator 508 can be formed by the sputtering method, the CVD method, the MBE method, the PLD method, the ALD method, or the like.

Second heat treatment may be performed at any time after the formation of the insulator to be the insulator 508. Excess oxygen included in the insulator 502 and the like moves into the semiconductor 506 by performing the second heat treatment, whereby defects (oxygen vacancies) in the semiconductor 506 can be reduced. Note that the second heat treatment may be performed at a temperature such that excess oxygen (oxygen) in the insulator 502 is diffused to the semiconductor 506. For example, the description of the first heat treatment may be referred to for the second heat treatment. Alternatively, the temperature of the second heat treatment is preferably lower than that of the first heat treatment. A temperature difference between the first heat treatment and the second heat treatment is to be 20° C. or more and 150° C. or less, preferably 40° C. or more and 100° C. or less. Accordingly, superfluous release of excess oxygen (oxygen) from the insulator 502 can be inhibited. Note that the second heat treatment is not necessarily performed when heating during formation of the films can work as heat treatment comparable to the second heat treatment.

Next, an insulator to be the insulator 518 is formed. The insulator to be the insulator 518 can be formed by the sputtering method, the CVD method, the MBE method, the PLD method, the ALD method, or the like.

Next, the insulator to be the insulator 518 is processed by the photolithography method or the like, so that the insulator 518 is formed.

Next, the insulator to be the insulator 508 is processed by the photolithography method or the like, so that the insulator 508 is formed. Note that the insulators to be the insulators 518 and 508 may be processed in the same photolithography process. Processing in the same photolithography process can reduce the number of manufacturing steps. Thus, productivity of a semiconductor device including the transistor 590 can be increased. Alternatively, the insulator to be the insulator 518 and the insulator to be the insulator 508 may be processed in different photolithography processes. Processing in different photolithography processes may facilitate formation of films with different shapes.

Next, the insulator 539 is processed by the photolithography method or the like, so that the insulator 510 is formed. Note that the insulator to be the insulator 518, the insulator to be the insulator 508, and the insulator 539 may be processed in the same photolithography process. Processing in the same photolithography process can reduce the number of manufacturing steps. Thus, productivity of a semiconductor device including the transistor 590 can be increased. Alternatively, the insulator to be the insulator 518, the insulator to be the insulator 508, and the insulator 539 may be processed in different photolithography processes. Processing in different photolithography processes may facilitate formation of films with different shapes.

At this time, the conductors 516a and 516b are exposed.

Next, a conductor is formed. The conductor can be formed by the sputtering method, the CVD method, the MBE method, the PLD method, the ALD method, or the like. The conductor is formed so as to fill the openings in the insulators 518, 508, and 510. Therefore, the CVD method (the MCVD method, in particular) is preferably used. A stacked-layer film of a conductor formed by the ALD method or the like and a conductor formed by the CVD method is preferred in some cases to increase adhesion of the conductor formed by the CVD method. For example, the stacked-layer film where titanium nitride and tungsten are formed in this order may be used.

Next, planarizing parallel to the reference surface such as the rear surface of the substrate, the treatment for removing an upper portion of the conductor is performed until only the conductors in the openings in the insulators 518, 508, and 510 are left. As a result, only top surfaces of the conductors in the openings in the insulators 518, 508, and 510 are exposed. At this time, the conductors in the openings in the insulators 518, 508 and 510 are referred to as the conductors 524a and 524b.

Next, a conductor is formed. The conductor can be formed by the sputtering method, the CVD method, the MBE method, the PLD method, the ALD method, or the like.

Figure 13B:
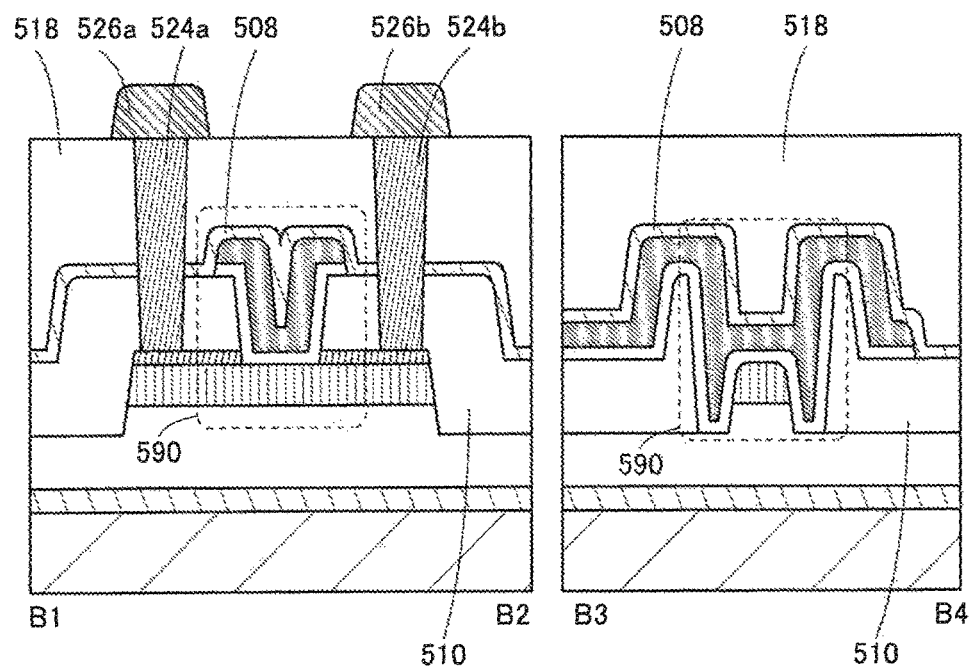

Next, the conductor is processed by the photolithography method or the like, so that the conductors 526a and 526b are formed (FIG. 13B).

Through the above steps, the transistor 590 illustrated in FIGS. 9A and 9B can be manufactured.

In the transistor 590, the size or the like of the offset region or the overlap region can be controlled by the thicknesses, shapes, or the like of the films. Therefore, the size or the like of the offset region or the overlap region can be smaller than a minimum feature size by the photolithography method; thus, the transistor can be easily miniaturized. In addition, since the parasitic capacitance is small, the transistor can have high frequency characteristics.

<Semiconductor Device>

An example of a semiconductor device of one embodiment of the present invention is shown below.

<Circuit>

An example of a circuit including a transistor of one embodiment of the present invention is shown below.

[Cmos Inverter]

Figure 14A:
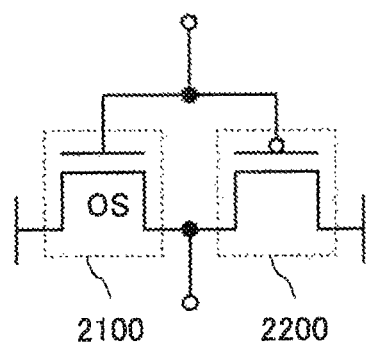
FIGS. 14A and 14B are circuit diagrams of a semiconductor device of one embodiment of the present invention.

A circuit diagram in FIG. 14A shows a configuration of a so-called CMOS inverter in which a p-channel transistor 2200 and an n-channel transistor 2100 are connected to each other in series and in which gates of them are connected to each other.

<Structure of Semiconductor Device>

Figure 15:
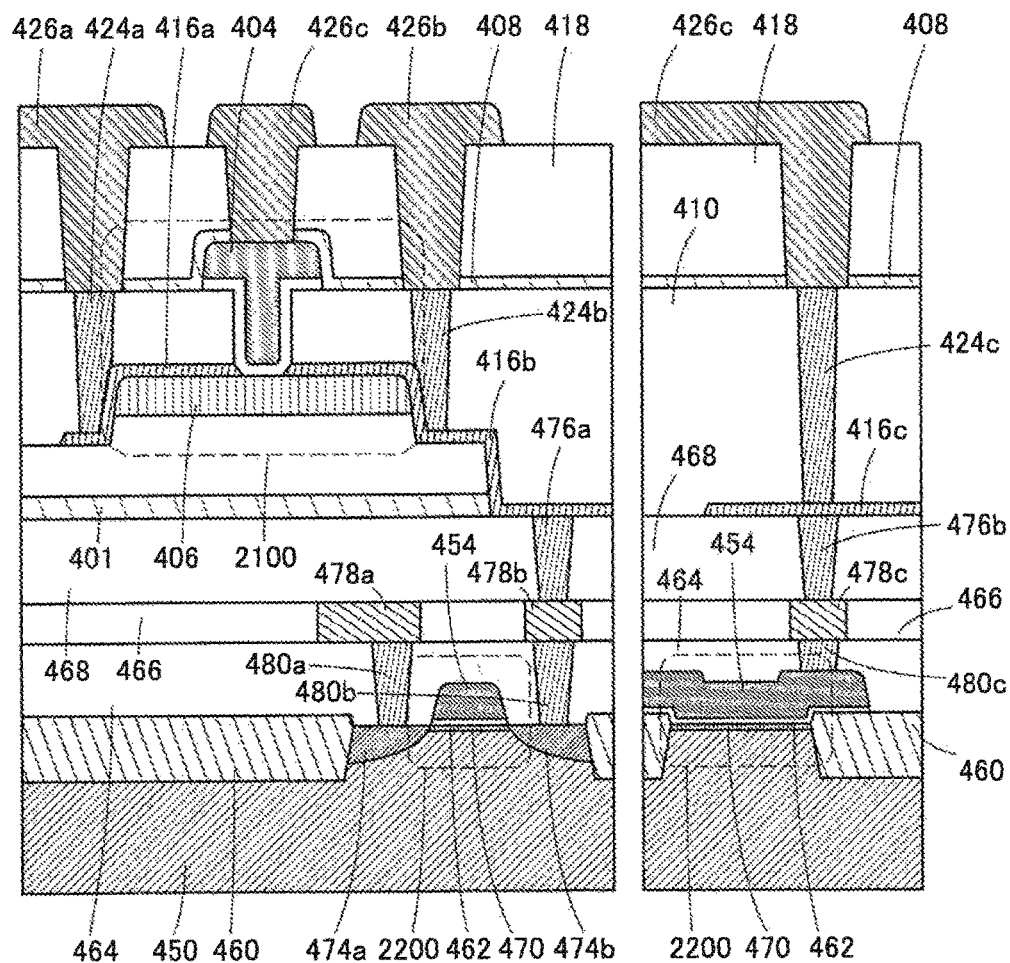
FIG. 15 is a cross-sectional view illustrating a semiconductor device of one embodiment of the present invention.

FIG. 15 is a cross-sectional view of the semiconductor device of FIG. 14A. The semiconductor device shown in FIG. 15 includes the transistor 2200 and the transistor 2100 above the transistor 2200. Although an example where the transistor 490 shown in FIGS. 1A and 1B is used as the transistor 2100 is shown, a semiconductor device of one embodiment of the present invention is not limited thereto. For example, the transistor 490 shown in FIG. 4A or 4B, the transistor 590 shown in FIGS. 9A and 9B, the transistor 590 shown in FIG. 10A or 10B can be used as the transistor 2100. Therefore, the description regarding the above-mentioned transistors is referred to for the transistor 2100 as appropriate.

The transistor 2200 shown in FIG. 15 is a transistor using a semiconductor substrate 450. The transistor 2200 includes a region 474a in the semiconductor substrate 450, a region 474b in the semiconductor substrate 450, a region 470 in the semiconductor substrate 450, an insulator 462, and a conductor 454. Note that the transistor 2200 does not necessarily include the region 470 in some cases.

In the transistor 2200, the regions 474a and 474b have a function as a source region and a drain region. In addition, the region 470 has a function of controlling a threshold voltage. The insulator 462 has a function as a gate insulator. The conductor 454 has a function as a gate electrode. Therefore, resistance of a channel formation region can be controlled by a potential applied to the conductor 454. In other words, conduction or non-conduction between the region 474a and the region 474b can be controlled by the potential applied to the conductor 454.

For the semiconductor substrate 450, a single-material semiconductor substrate of silicon, germanium, or the like or a compound semiconductor substrate of silicon carbide, silicon germanium, gallium arsenide, indium phosphide, zinc oxide, gallium oxide, or the like may be used, for example. A single crystal silicon substrate is preferably used as the semiconductor substrate 450.

For the semiconductor substrate 450, a semiconductor substrate including impurities imparting n-type conductivity is used. However, a semiconductor substrate including impurities imparting p-type conductivity may be used as the semiconductor substrate 450. In that case, a well including impurities imparting the n-type conductivity is provided in a region where the transistor 2200 is formed. Alternatively, the semiconductor substrate 450 may be an i-type semiconductor substrate.

A top surface of the semiconductor substrate 450 preferably has a (110) plane. Then, on-state characteristics of the transistor 2200 can be improved.

The regions 474a and 474b are regions including impurities imparting the p-type conductivity. Accordingly, the transistor 2200 has a structure of a p-channel transistor.

The region 470 is a region where the concentration of impurities imparting n-type conductivity is higher than that in the semiconductor substrate 450 or the well. With the region 470, the threshold voltage of the transistor 2200 can be shifted in the negative direction. Accordingly, normally-off electrical characteristics can be easily obtained even when a conductor with a high work function is used as the conductor 454. The conductor with the high work function has higher heat resistance than a conductor with a low work function in many cases, and thus may facilitate a degree of freedom of later steps and increase performance of the semiconductor device.

Note that the transistor 2200 is separated from an adjacent transistor by a region 460 and the like. The region 460 is an insulating region.

The semiconductor device shown in FIG. 15 includes an insulator 464, an insulator 466, an insulator 468, a conductor 480a, a conductor 480b, a conductor 480c, a conductor 478a, a conductor 478b, a conductor 478c, a conductor 476a, a conductor 476b, a conductor 416c, a conductor 424c, and a conductor 426c.

The insulator 464 is over the transistor 2200. The insulator 466 is over the insulator 464. The insulator 468 is over the insulator 466. The transistor 2100 and the conductor 416c are over the insulator 468.

The insulator 464 includes an opening reaching the region 474a, an opening reaching the region 474b, and an opening reaching the conductor 454, in which the conductor 480a, the conductor 480b, and the conductor 480c are embedded, respectively.

In addition, the insulator 466 includes an opening reaching the conductor 480a, an opening reaching the conductor 480b, and an opening reaching the conductor 480c, in which the conductor 478a, the conductor 478b, and the conductor 478c are embedded, respectively.

In addition, the insulator 468 includes an opening reaching the conductor 478b and an opening reaching the conductor 478c, in which the conductor 476a and the conductor 476b are embedded, respectively.

The conductor 476a is in contact with the conductor 416b of the transistor 2100. The conductor 476b is in contact with the conductor 416c.

The insulator 410 includes an opening reaching the conductor 416c. In addition, the conductor 424c is embedded in the opening.

The insulators 418 and 408 include an opening reaching the conductor 424c and an opening reaching the conductor 404. In addition, the conductor 424c and the conductor 404 are electrically connected to each other by the conductor 426c through the openings.

Figure 16:
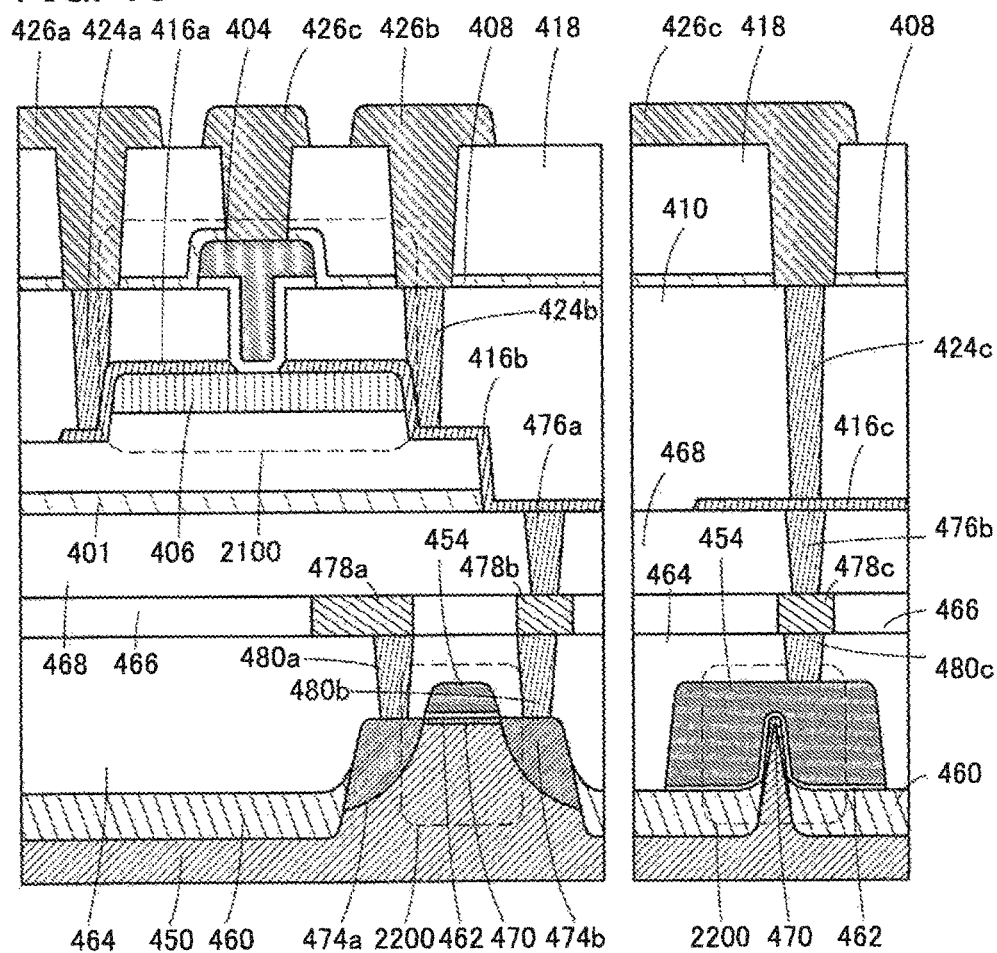
FIG. 16 is a cross-sectional view illustrating a semiconductor device of one embodiment of the present invention.

Note that a semiconductor device in FIG. 16 is the same as the semiconductor device in FIG. 15 except a structure of the transistor 2200. Therefore, the description of the semiconductor device in FIG. 15 is referred to for the semiconductor device in FIG. 16. In the semiconductor device in FIG. 16, the transistor 2200 is a FIN-type transistor. The effective channel width is increased in the FIN-type transistor 2200, whereby the on-state characteristics of the transistor 2200 can be improved. In addition, since contribution of the electric field of the gate electrode can be increased, the off-state characteristics of the transistor 2200 can be improved.

Figure 17:
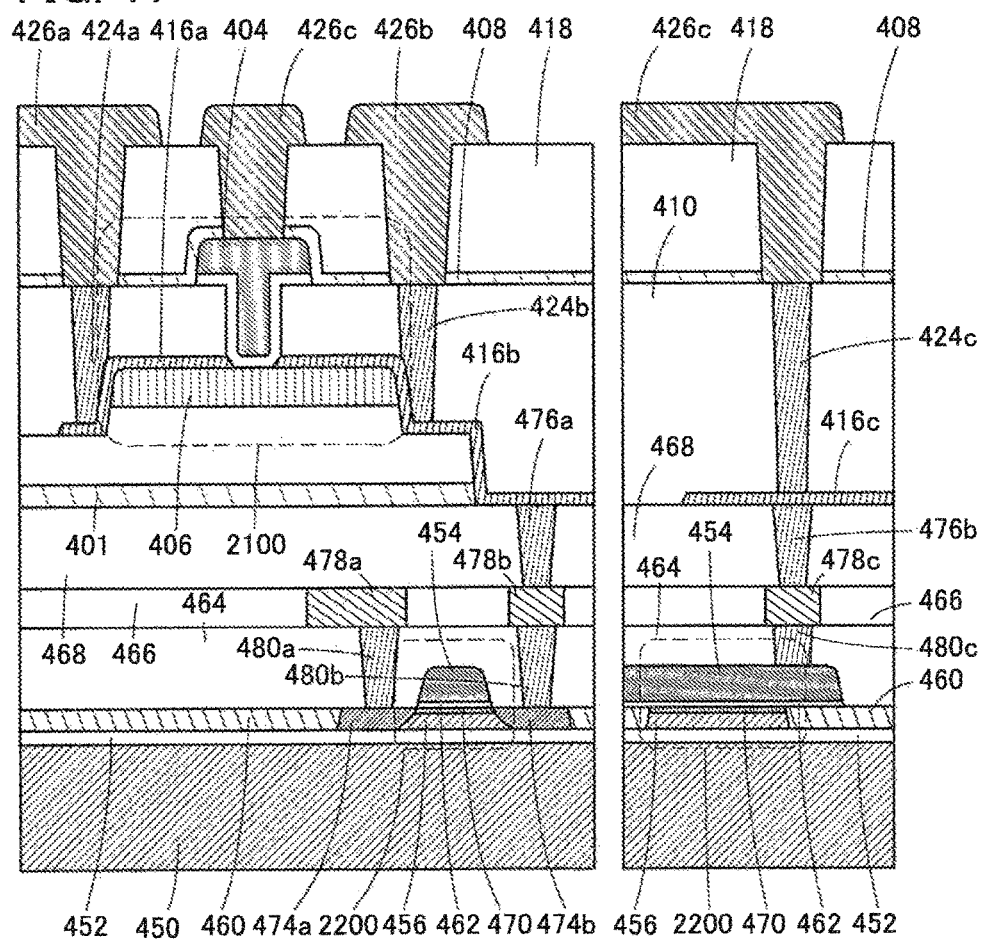
FIG. 17 is a cross-sectional view illustrating a semiconductor device of one embodiment of the present invention.

Note that a semiconductor device in FIG. 17 is the same as the semiconductor device in FIG. 15 except a structure of the transistor 2200. Therefore, the description of the semiconductor device in FIG. 15 is referred to for the semiconductor device in FIG. 17. In the semiconductor device in FIG. 17, the transistor 2200 is formed using an SOI substrate. In the structure in FIG. 17, a region 456 is separated from the semiconductor substrate 450 with an insulator 452 provided therebetween. Since the SOI substrate is used, a punch-through current can be reduced; and thus the off-state characteristics of the transistor 2200 can be improved. Note that the insulator 452 can be formed by turning part of the semiconductor substrate 450 into an insulator. For example, silicon oxide can be used as the insulator 452.

In each of the semiconductor devices shown in FIG. 15, FIG. 16, and FIG. 17, a p-channel transistor is formed utilizing a semiconductor substrate, and an n-channel transistor is formed above that; therefore, an occupation area of the element can be reduced. That is, the integration degree of the semiconductor device can be improved. In addition, the manufacturing process can be simplified compared to the case where an n-channel transistor and a p-channel transistor are formed utilizing the same semiconductor substrate; therefore, the productivity of the semiconductor device can be increased. Moreover, the yield of the semiconductor device can be improved. For the p-channel transistor, some complicated steps such as formation of lightly doped drain (LDD) regions, formation of a shallow trench structure, or distortion design can be omitted in some cases. Therefore, the productivity and yield of the semiconductor device in FIG. 15, FIG. 16, or FIG. 17 can be increased in some cases, compared to a semiconductor device where an n-channel transistor is formed utilizing the semiconductor substrate.

[CMOS Analog Switch]

Figure 14B:
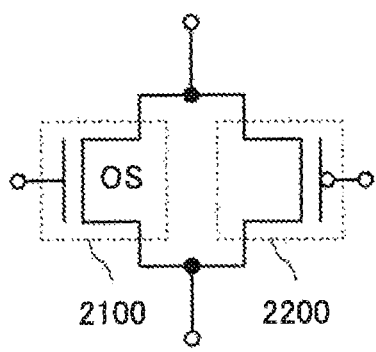

A circuit diagram in FIG. 14B shows a configuration in which sources of the transistors 2100 and 2200 are connected to each other and drains of the transistors 2100 and 2200 are connected to each other. With such a configuration, the transistors can function as a so-called CMOS analog switch.

[Memory Device Example]

Figure 18A:
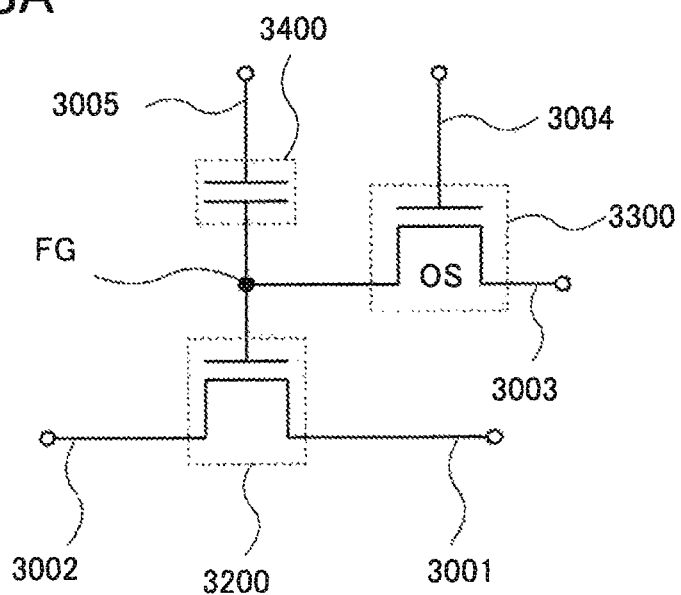
FIGS. 18A and 18B are circuit diagrams of a memory device of one embodiment of the present invention.
Figure 18B:
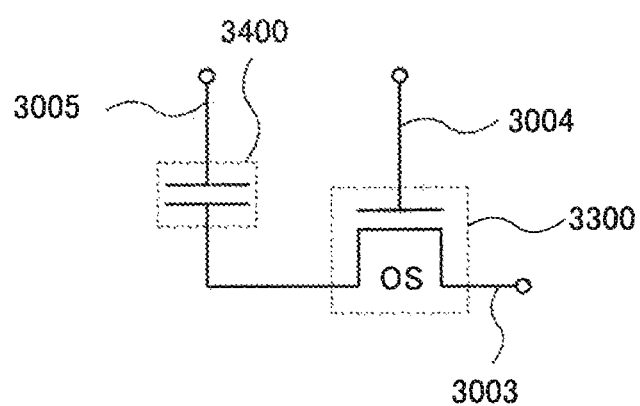

An example of a semiconductor device (memory device) which includes the transistor of one embodiment of the present invention, which can retain stored data even when not powered, and which has an unlimited number of write cycles is shown in FIGS. 18A and 18B.

The semiconductor device illustrated in FIG. 18A includes a transistor 3200 using a first semiconductor, a transistor 3300 using a second semiconductor, and a capacitor 3400. Note that any of the above-described transistors can be used as the transistor 3300.

The transistor 3300 is a transistor using an oxide semiconductor. Since the off-state current of the transistor 3300 is low, stored data can be retained for a long period at a predetermined node of the semiconductor device. In other words, power consumption of the semiconductor device can be reduced because refresh operation becomes unnecessary or the frequency of refresh operation can be extremely low.

In FIG. 18A, a first wiring 3001 is electrically connected to a source of the transistor 3200. A second wiring 3002 is electrically connected to a drain of the transistor 3200. A third wiring 3003 is electrically connected to one of the source and the drain of the transistor 3300. A fourth wiring 3004 is electrically connected to the gate of the transistor 3300. The gate of the transistor 3200 and the other of the source and the drain of the transistor 3300 are electrically connected to the one electrode of the capacitor 3400. A fifth wiring 3005 is electrically connected to the other electrode of the capacitor 3400.

The semiconductor device in FIG. 18A has a feature that the potential of the gate of the transistor 3200 can be retained, and thus enables writing, retaining, and reading of data as follows.

Writing and holding of data will be described. First, the potential of the fourth wiring 3004 is set to a potential at which the transistor 3300 is turned on, so that the transistor 3300 is turned on. Accordingly, the potential of the third wiring 3003 is supplied to a node FG where the gate of the transistor 3200 and the one electrode of the capacitor 3400 are electrically connected to each other. That is, a predetermined charge is supplied to the gate of the transistor 3200 (writing). Here, one of two kinds of charges providing different potential levels (hereinafter referred to as a low-level charge and a high-level charge) is supplied. After that, the potential of the fourth wiring 3004 is set to a potential at which the transistor 3300 is turned off, so that the transistor 3300 is turned off. Thus, the charge is held at the node FG (retaining).

Since the off-state current of the transistor 3300 is extremely low, the charge of the node FG is retained for a long time.

Next, reading of data will be described. An appropriate potential (a reading potential) is supplied to the fifth wiring 3005 while a predetermined potential (a constant potential) is supplied to the first wiring 3001, whereby the potential of the second wiring 3002 varies depending on the amount of charge retained in the node FG. This is because in the case of using an n-channel transistor as the transistor 3200, an apparent threshold voltage $V_{th\_H}$ at the time when the high-level charge is given to the gate of the transistor 3200 is lower than an apparent threshold voltage $V_{th\_L}$ at the time when the low-level charge is given to the gate of the transistor 3200. Here, an apparent threshold voltage refers to the potential of the fifth wiring 3005 which is needed to turn on the transistor 3200. Thus, the potential of the fifth wiring 3005 is set to a potential $V_0$ which is between $V_{th\_H}$ and $V_{th\_L}$, whereby charge supplied to the node FG can be determined. For example, in the case where the high-level charge is supplied to the node FG in writing and the potential of the fifth wiring 3005 is $V_0$ ($>V_{th\_H}$), the transistor 3200 is turned on. On the other hand, in the case where the low-level charge is supplied to the node FG in writing, even when the potential of the fifth wiring 3005 is $V_0$ ($<V_{th\_L}$), the transistor 3200 remains off. Thus, the data retained in the node FG can be read by determining the potential of the second wiring 3002.

Note that in the case where memory cells are arrayed, it is necessary that data of a desired memory cell is read in read operation. In the case where data of the other memory cells is not read, the fifth wiring 3005 may be supplied with a potential at which the transistor 3200 is turned off regardless of the charge supplied to the node FG, that is, a potential lower than $V_{th\_H}$. Alternatively, the fifth wiring 3005 may be supplied with a potential at which the transistor 3200 is turned on regardless of the charge supplied to the node FG, that is, a potential higher than $V_{th\_L}$.

The semiconductor device in FIG. 18B is different from the semiconductor device in FIG. 18A in that the transistor 3200 is not provided. Also in this case, writing and retaining operation of data can be performed in a manner similar to the semiconductor device in FIG. 18A.

Reading of data in the semiconductor device in FIG. 18B is described. When the transistor 3300 is turned on, the third wiring 3003 which is in a floating state and the capacitor 3400 are in the conduction state, and the charge is redistributed between the third wiring 3003 and the capacitor 3400. As a result, the potential of the third wiring 3003 is changed. The amount of change in potential of the third wiring 3003 varies depending on the potential of the one electrode of the capacitor 3400 (or the charge accumulated in the capacitor 3400).

For example, the potential of the third wiring 3003 after the charge redistribution is $(C_B \times V_{B0} + C \times V)/(C_B + C)$, where V is the potential of the one electrode of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of the one electrode of the capacitor 3400 is $V_1$ and $V_0$ ($V_1 > V_0$), the potential of the third wiring 3003 in the case of the one electrode of the capacitor 3400 retaining the potential $V_1$ ($=(C_B \times V_{B0} + C \times V_1)/(C_B + C)$) is higher than the potential of the third wiring 3003 in the case of the one electrode of the capacitor 3400 retaining the potential $V_0$ ($=(C_B \times V_{B0} + C \times V_0)/(C_B + C)$).

Then, by comparing the potential of the third wiring 3003 with a predetermined potential, data can be read.

In this case, a transistor including the first semiconductor may be used for a driver circuit for driving a memory cell, and a transistor including the second semiconductor may be stacked over the driver circuit as the transistor 3300.

When including a transistor using an oxide semiconductor and having an extremely low off-state current, the semiconductor device described above can retain stored data for a long time. In other words, refresh operation becomes unnecessary or the frequency of the refresh operation can be extremely low, which leads to a sufficient reduction in power consumption of the semiconductor device. Moreover, stored data can be retained for a long time even when power is not supplied (note that a potential is preferably fixed).

Further, in the semiconductor device, high voltage is not needed for writing data and deterioration of elements is less likely to occur. Unlike in a conventional nonvolatile memory, for example, it is not necessary to inject and extract electrons into and from a floating gate; thus, a problem such as deterioration of an insulator is not caused. That is, the semiconductor device of one embodiment of the present invention does not have a limit on the number of times of rewriting data, which is a problem of a conventional nonvolatile memory, and the reliability thereof is drastically improved. Furthermore, data is written depending on the state of the transistor (on or off), whereby high-speed operation can be easily achieved.

<CPU>

A CPU including a semiconductor device such as any of the above-described transistors or the above-described memory device is described below.

Figure 19:
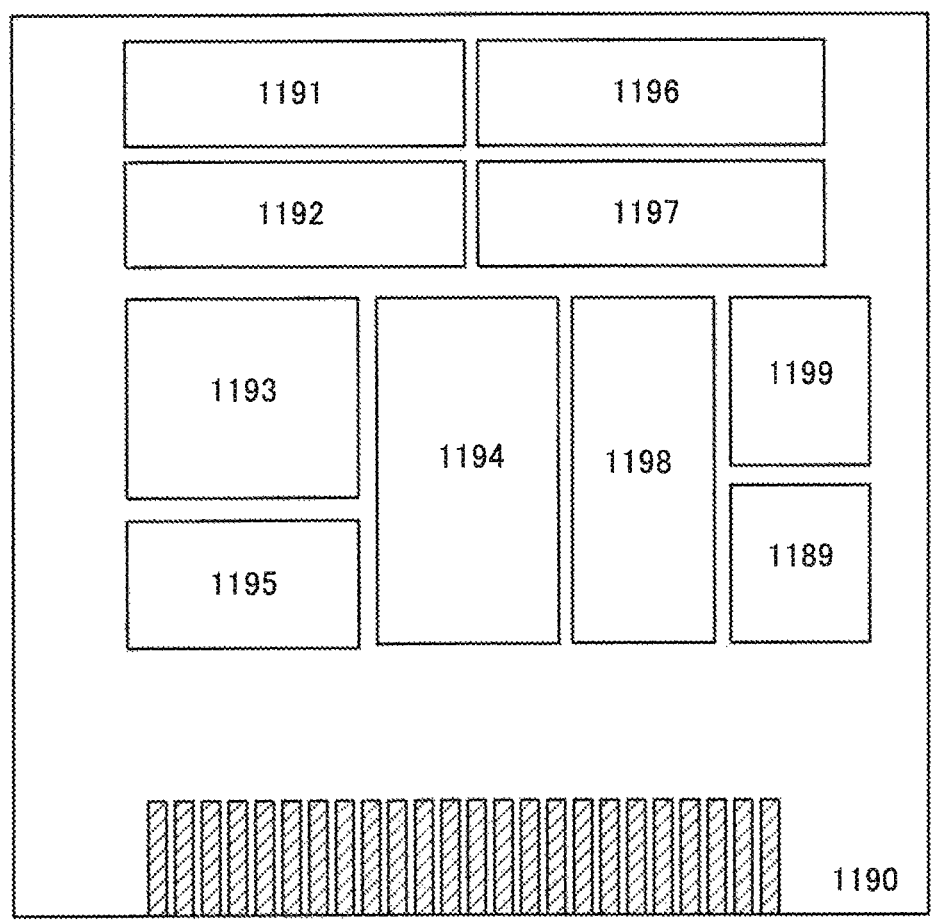
FIG. 19 is a block diagram illustrating a CPU of one embodiment of the present invention.

FIG. 19 is a block diagram illustrating a configuration example of a CPU including any of the above-described transistors as a component.

The CPU illustrated in FIG. 19 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198, a rewritable ROM 1199, and an ROM interface 1189. A semiconductor substrate, an SOI substrate, a glass substrate, or the like is used as the substrate 1190. The ROM 1199 and the ROM interface 1189 may be provided over a separate chip. Needless to say, the CPU in FIG. 19 is just an example of a simplified structure, and an actual CPU may have a variety of structures depending on the application. For example, the CPU may have the following configuration: a structure including the CPU illustrated in FIG. 19 or an arithmetic circuit is considered as one core; a plurality of the cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 processes an interrupt request from an external input/output device or a peripheral circuit depending on its priority or a mask state. The register controller 1197 generates an address of the register 1196, and reads/writes data from/to the register 1196 depending on the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal on the basis of a reference clock signal, and supplies the internal clock signal to the above circuits.

In the CPU illustrated in FIG. 19, a memory cell is provided in the register 1196. For the memory cell of the register 1196, any of the above-described transistors, the above-described memory device, or the like can be used.

In the CPU illustrated in FIG. 19, the register controller 1197 selects operation of retaining data in the register 1196 in accordance with an instruction from the ALU 1191. That is, the register controller 1197 selects whether data is held by a flip-flop or by a capacitor in the memory cell included in the register 1196. When data holding by the flip-flop is selected, a power supply voltage is supplied to the memory cell in the register 1196. When data holding by the capacitor is selected, the data is rewritten in the capacitor, and supply of the power supply voltage to the memory cell in the register 1196 can be stopped.

Figure 20:
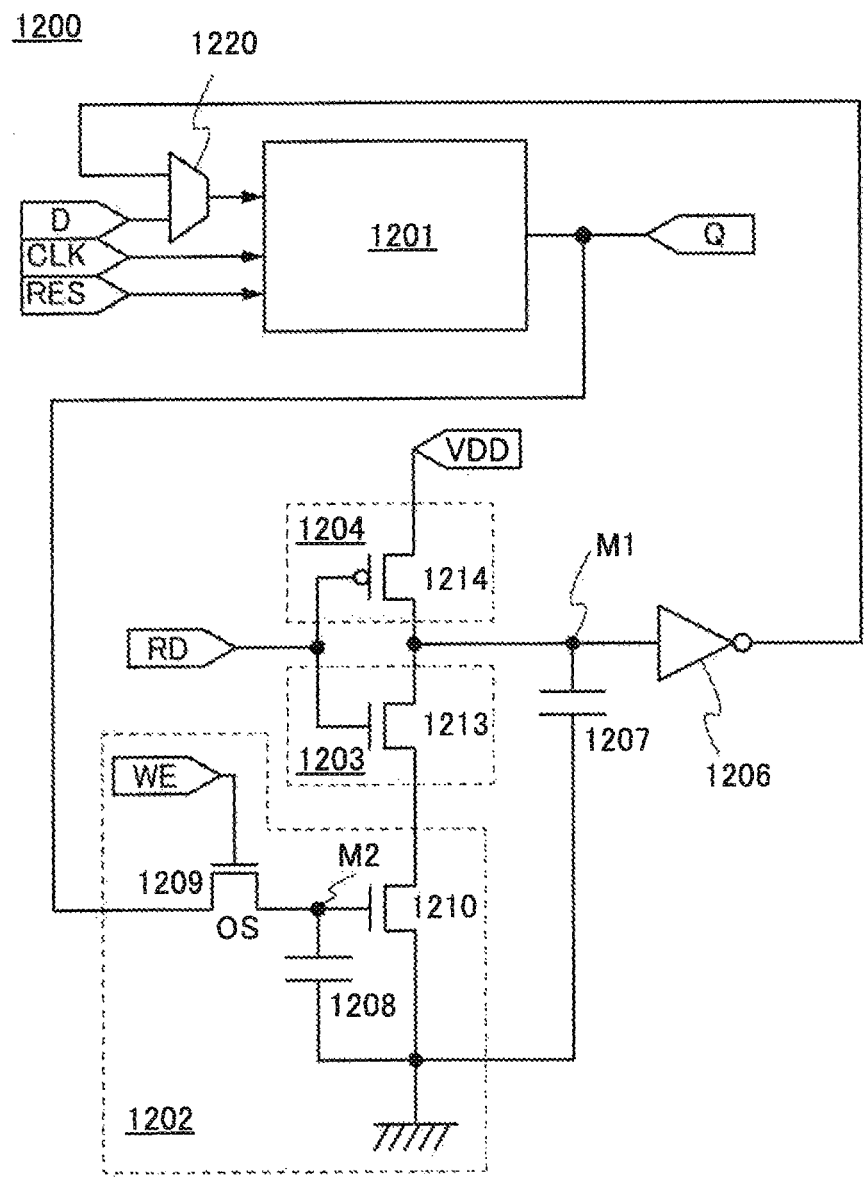
FIG. 20 is a circuit diagram of a memory element of one embodiment of the present invention.

FIG. 20 is an example of a circuit diagram of a memory element 1200 that can be used as the register 1196. A memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the above-described memory device can be used as the circuit 1202. When supply of a power supply voltage to the memory element 1200 is stopped, GND (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a line which can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a line which can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the line which can supply a low power supply potential (e.g., a GND line). The other of the pair of electrodes of the capacitor 1208 can be supplied with a constant potential. For example, the other of the pair of electrodes of the capacitor 1208 can be supplied with a low power supply potential (e.g., GND) or a high power supply potential (e.g., VDD). The other of the pair of electrodes of the capacitor 1208 is electrically connected to the line which can supply a low power supply potential (e.g., a GND line).

The capacitor 1207 and the capacitor 1208 are not necessarily provided as long as the parasitic capacitance of the transistor, the line, or the like is actively utilized.

A control signal WE is input to the gate of the transistor 1209. As for each of the switch 1203 and the switch 1204, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data retained in the circuit 1201 is input to the other of the source and the drain of the transistor 1209. FIG. 20 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 20, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 20, the transistors included in the memory element 1200 except for the transistor 1209 can each be a transistor in which a channel is formed in a film formed using a semiconductor other than an oxide semiconductor or in the substrate 1190. For example, the transistor can be a transistor whose channel is formed in a silicon film or a silicon substrate. Alternatively, all the transistors in the memory element 1200 may be a transistor in which a channel is formed in an oxide semiconductor. Further alternatively, in the memory element 1200, a transistor in which a channel is formed in an oxide semiconductor can be included besides the transistor 1209, and a transistor in which a channel is formed in a layer or the substrate 1190 including a semiconductor other than an oxide semiconductor can be used for the rest of the transistors.

As the circuit 1201 in FIG. 20, for example, a flip-flop circuit can be used. As the logic element 1206, for example, an inverter or a clocked inverter can be used.

In a period during which the memory element 1200 is not supplied with the power supply voltage, the semiconductor device of one embodiment of the present invention can retain data stored in the circuit 1201 by the capacitor 1208 which is provided in the circuit 1202.

The off-state current of a transistor in which a channel is formed in an oxide semiconductor is extremely low. For example, the off-state current of a transistor in which a channel is formed in an oxide semiconductor is significantly lower than that of a transistor in which a channel is formed in silicon having crystallinity. Thus, when the transistor is used as the transistor 1209, a signal held in the capacitor 1208 is retained for a long time also in a period during which the power supply voltage is not supplied to the memory element 1200. The memory element 1200 can accordingly retain the stored content (data) also in a period during which the supply of the power supply voltage is stopped.

Since the above-described memory element performs pre-charge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Therefore, after supply of the power supply voltage to the memory element 1200 is restarted, the signal retained by the capacitor 1208 can be converted into the one corresponding to the state (the on state or the off state) of the transistor 1210 to be read from the circuit 1202. Consequently, an original signal can be accurately read even when a potential corresponding to the signal retained by the capacitor 1208 varies to some degree.

By using the above-described memory element 1200 for a memory device such as a register or a cache memory included in a processor, data in the memory device can be prevented from being lost owing to the stop of the supply of the power supply voltage. Further, shortly after the supply of the power supply voltage is restarted, the memory element can be returned to the same state as that before the power supply is stopped. Therefore, the power supply can be stopped even for a short time in the processor or one or a plurality of logic circuits included in the processor. Accordingly, power consumption can be suppressed.

Although the memory element 1200 is used in a CPU as an example, the memory element 1200 can also be used in an LSI such as a digital signal processor (DSP), a custom LSI, or a programmable logic device (PLD), and a radio frequency identification (RF-ID).

<Display Device>

The following shows configuration examples of a display device of one embodiment of the present invention.

[Configuration Example]

Figure 21A:
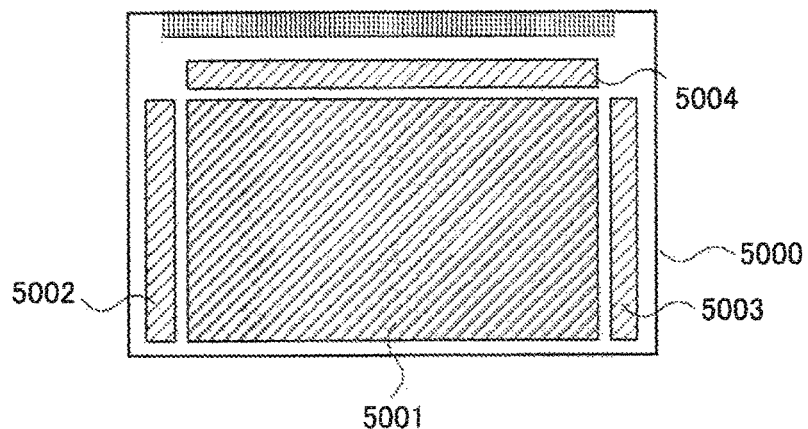
FIGS. 21A to 21C are a top view and circuit diagrams of a display device of one embodiment of the present invention.
Figure 21B:
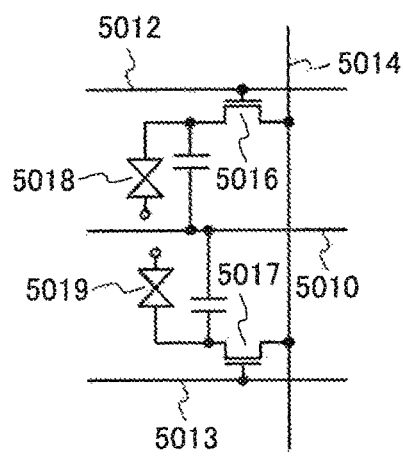
Figure 21C:
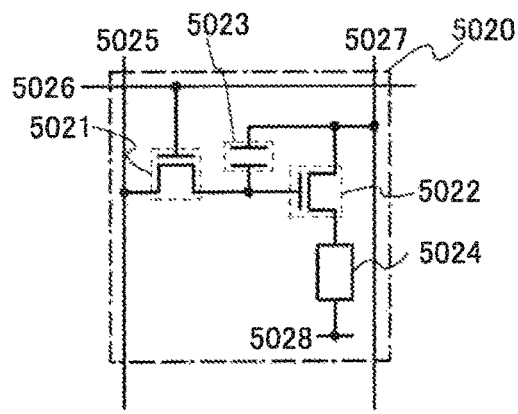

FIG. 21A is a top view of a display device of one embodiment of the present invention. FIG. 21B illustrates a pixel circuit where a liquid crystal element is used for a pixel of a display device of one embodiment of the present invention. FIG. 21C illustrates a pixel circuit where an organic EL element is used for a pixel of a display device of one embodiment of the present invention.

Any of the above-described transistors can be used as a transistor used for the pixel. Here, an example in which an n-channel transistor is used is shown. Note that a transistor manufactured through the same steps as the transistor used for the pixel may be used for a driver circuit. Thus, by using any of the above-described transistors for a pixel or a driver circuit, the display device can have high display quality and/or high reliability.

FIG. 21A illustrates an example of an active matrix display device. A pixel portion 5001, a first scan line driver circuit 5002, a second scan line driver circuit 5003, and a signal line driver circuit 5004 are provided over a substrate 5000 in the display device. The pixel portion 5001 is electrically connected to the signal line driver circuit 5004 through a plurality of signal lines and is electrically connected to the first scan line driver circuit 5002 and the second scan line driver circuit 5003 through a plurality of scan lines. Pixels including display elements are provided in respective regions divided by the scan lines and the signal lines. The substrate 5000 of the display device is electrically connected to a timing control circuit (also referred to as a controller or a control IC) through a connection portion such as a flexible printed circuit (FPC).

The first scan line driver circuit 5002, the second scan line driver circuit 5003, and the signal line driver circuit 5004 are formed over the substrate 5000 where the pixel portion 5001 is formed. Therefore, the display device can be manufactured at cost lower than that in the case where a driver circuit is separately formed. Further, in the case where a driver circuit is separately formed, the number of line connections is increased. By providing the driver circuit over the substrate 5000, the number of line connections can be reduced. Accordingly, the reliability and/or yield can be improved.

[Liquid Crystal Display Device]

FIG. 21B illustrates an example of a circuit configuration of the pixel. Here, a pixel circuit which is applicable to a pixel of a VA liquid crystal display device or the like is illustrated.

This pixel circuit can be used for a structure in which one pixel includes a plurality of pixel electrodes. The pixel electrodes are connected to different transistors, and the transistors can be driven with different gate signals. Accordingly, signals applied to individual pixel electrodes in a multi-domain pixel can be controlled independently.

A scan line 5012 of a transistor 5016 and a scan line 5013 of a transistor 5017 are separated so that different gate signals can be supplied thereto. In contrast, a signal line 5014 is shared by the transistors 5016 and 5017. Any of the above-described transistors can be used as appropriate as each of the transistors 5016 and 5017. Thus, the liquid crystal display device can have high display quality and/or high reliability.

A first pixel electrode is electrically connected to the transistor 5016 and a second pixel electrode is electrically connected to the transistor 5017. The first pixel electrode and the second pixel electrode are separated. There is no specific limitation on the shapes of the first electrode and the second electrode. For example, the first pixel electrode has a V shape.

A gate electrode of the transistor 5016 is electrically connected to the scan line 5012, and a gate electrode of the transistor 5017 is electrically connected to the scan line 5013. When different gate signals are supplied to the scan line 5012 and the scan line 5013, operation timings of the transistor 5016 and the transistor 5017 can be varied. As a result, alignment of liquid crystals can be controlled.

Furthermore, a capacitor may be formed using a capacitor line 5010, a gate insulator functioning as a dielectric, and a capacitor electrode electrically connected to the first pixel electrode or the second pixel electrode.

The pixel structure is a multi-domain structure in which a first liquid crystal element 5018 and a second liquid crystal element 5019 are provided in one pixel. The first liquid crystal element 5018 includes the first pixel electrode, a counter electrode, and a liquid crystal layer therebetween. The second liquid crystal element 5019 includes the second pixel electrode, the counter electrode, and the liquid crystal layer therebetween.

Note that a pixel circuit of the display device of one embodiment of the present invention is not limited to that shown in FIG. 21B. For example, a switch, a resistor, a capacitor, a transistor, a sensor, a logic circuit, or the like may be added to the pixel circuit shown in FIG. 21B.

[Organic EL Display Device]

FIG. 21C illustrates another example of a circuit configuration of the pixel. Here, a pixel structure of a display device using an organic EL element is shown.

In an organic EL element, by application of voltage to a light-emitting element, electrons are injected from one of a pair of electrodes included in the organic EL element and holes are injected from the other of the pair of electrodes, into a layer containing a light-emitting organic compound; thus, current flows. The electrons and holes are recombined, and thus, the light-emitting organic compound is excited. The light-emitting organic compound returns to a ground state from the excited state, thereby emitting light. Based on such a mechanism, such a light-emitting element is referred to as a current-excitation type light-emitting element.

FIG. 21C illustrates an example of a pixel circuit. Here, one pixel includes two n-channel transistors. Note that any of the above-described transistors can be used as the re-channel transistors. Further, digital time grayscale driving can be employed for the pixel circuit.

The configuration of the applicable pixel circuit and operation of a pixel employing digital time grayscale driving will be described.

A pixel 5020 includes a switching transistor 5021, a driver transistor 5022, a light-emitting element 5024, and a capacitor 5023. A gate electrode of the switching transistor 5021 is connected to a scan line 5026, a first electrode (one of a source electrode and a drain electrode) of the switching transistor 5021 is connected to a signal line 5025, and a second electrode (the other of the source electrode and the drain electrode) of the switching transistor 5021 is connected to a gate electrode of the driver transistor 5022. The gate electrode of the driver transistor 5022 is connected to a power supply line 5027 through the capacitor 5023, a first electrode of the driver transistor 5022 is connected to the power supply line 5027, and a second electrode of the driver transistor 5022 is connected to a first electrode (a pixel electrode) of the light-emitting element 5024. A second electrode of the light-emitting element 5024 corresponds to a common electrode 5028. The common electrode 5028 is electrically connected to a common potential line provided over the same substrate.

As each of the switching transistor 5021 and the driver transistor 5022, any of the above-described transistors can be used as appropriate. In this manner, an organic EL display device having high display quality and/or high reliability can be provided.

The potential of the second electrode (the common electrode 5028) of the light-emitting element 5024 is set to be a low power supply potential. Note that the low power supply potential is lower than a high power supply potential supplied to the power supply line 5027. For example, the low power supply potential can be GND, 0 V, or the like. The high power supply potential and the low power supply potential are set to be higher than or equal to the forward threshold voltage of the light-emitting element 5024, and the difference between the potentials is applied to the light-emitting element 5024, whereby current is supplied to the light-emitting element 5024, leading to light emission. The forward voltage of the light-emitting element 5024 refers to a voltage at which a desired luminance is obtained, and includes at least forward threshold voltage.

Note that gate capacitance of the driver transistor 5022 may be used as a substitute for the capacitor 5023 in some cases, so that the capacitor 5023 can be omitted. The gate capacitance of the driver transistor 5022 may be formed between the channel formation region and the gate electrode.

Next, a signal input to the driver transistor 5022 is described. In the case of a voltage-input voltage driving method, a video signal for turning on or off the driver transistor 5022 is input to the driver transistor 5022. In order for the driver transistor 5022 to operate in a linear region, voltage higher than the voltage of the power supply line 5027 is applied to the gate electrode of the driver transistor 5022. Note that voltage higher than or equal to voltage which is the sum of power supply line voltage and the threshold voltage $V_{th}$ of the driver transistor 5022 is applied to the signal line 5025.

In the case of performing analog grayscale driving, a voltage higher than or equal to a voltage which is the sum of the forward voltage of the light-emitting element 5024 and the threshold voltage $V_{th}$ of the driver transistor 5022 is applied to the gate electrode of the driver transistor 5022. A video signal by which the driver transistor 5022 is operated in a saturation region is input, so that current is supplied to the light-emitting element 5024. In order for the driver transistor 5022 to operate in a saturation region, the potential of the power supply line 5027 is set higher than the gate potential of the driver transistor 5022. When an analog video signal is used, it is possible to supply current to the light-emitting element 5024 in accordance with the video signal and perform analog grayscale driving.

Note that in the display device of one embodiment of the present invention, a pixel configuration is not limited to that shown in FIG. 21C. For example, a switch, a resistor, a capacitor, a sensor, a transistor, a logic circuit, or the like may be added to the pixel circuit shown in FIG. 21C.

In the case where any of the above-described transistors is used for the circuit shown in FIGS. 21A to 21C, the source electrode (the first electrode) is electrically connected to the low potential side and the drain electrode (the second electrode) is electrically connected to the high potential side. Further, the potential of the first gate electrode may be controlled by a control circuit or the like and the potential described above as an example, e.g., a potential lower than the potential applied to the source electrode, may be input to the second gate electrode.

<Electronic Device>

The semiconductor device of one embodiment of the present invention can be used for display devices, personal computers, image reproducing devices provided with recording media (typically, devices which reproduce the content of recording media such as digital versatile discs (DVDs) and have displays for displaying the reproduced images), or the like. Other examples of electronic devices that can be equipped with the semiconductor device of one embodiment of the present invention are mobile phones, game machines including portable game consoles, portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 22A to 22F illustrate specific examples of these electronic devices.

Figure 22A:
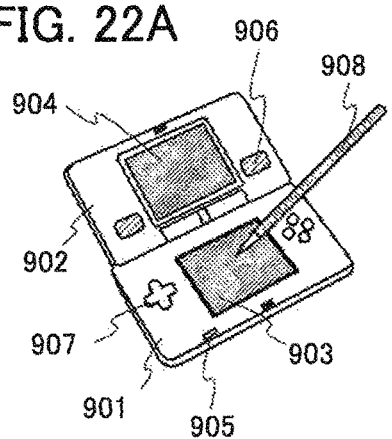
FIGS. 22A to 22F each illustrate an electronic device of one embodiment of the present invention.

FIG. 22A illustrates a portable game console including a housing 901, a housing 902, a display portion 903, a display portion 904, a microphone 905, a speaker 906, an operation key 907, a stylus 908, and the like. Although the portable game machine in FIG. 22A has the two display portions 903 and 904, the number of display portions included in a portable game console is not limited to this.

Figure 22B:
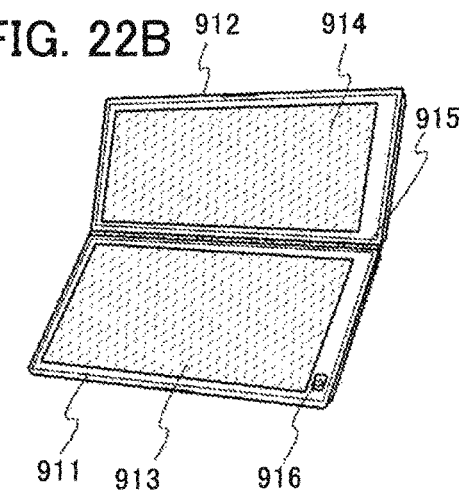

FIG. 22B illustrates a portable data terminal including a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. An image on the first display portion 913 may be switched depending on the angle between the first housing 911 and the second housing 912 at the joint 915. A display device with a position input function may be used as at least one of the first display portion 913 and the second display portion 914. Note that the position input function can be added by provision of a touch panel in a display device. Alternatively, the position input function can be added by provision of a photoelectric conversion element called a photosensor in a pixel portion of a display device.

Figure 22C:
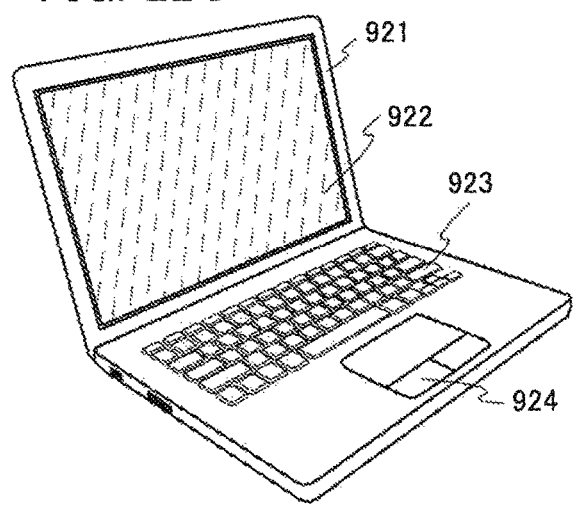

FIG. 22C illustrates a laptop personal computer, which includes a housing 921, a display portion 922, a keyboard 923, a pointing device 924, and the like.

Figure 22D:
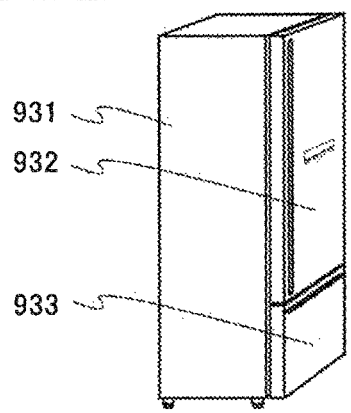

FIG. 22D illustrates an electric refrigerator-freezer including a housing 931, a door for a refrigerator 932, a door for a freezer 933, and the like.

Figure 22E:
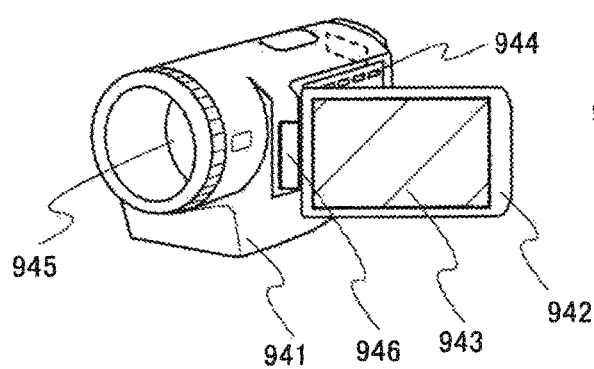

FIG. 22E illustrates a video camera, which includes a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. An image displayed on the display portion 943 may be switched in accordance with the angle at the joint 946 between the first housing 941 and the second housing 942.

Figure 22F:
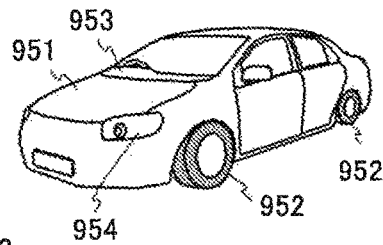

FIG. 22F illustrates an ordinary vehicle including a car body 951, wheels 952, a dashboard 953, lights 954, and the like.

REFERENCE NUMERALS

400: substrate, 401: insulator, 402: insulator, 404: conductor, 406: semiconductor, 406a: semiconductor layer, 406b: semiconductor layer, 406c: semiconductor layer, 408: insulator, 410: insulator, 412: insulator, 413: conductor, 416: conductor, 416a: conductor, 416b: conductor, 416c: conductor, 418: insulator, 424a: conductor, 424b: conductor, 424c: conductor, 426a: conductor, 426b: conductor, 426c: conductor, 438: insulator, 439: insulator, 450: semiconductor substrate, 452: insulator, 454: conductor, 456: region, 460: region, 462: insulator, 464: insulator, 466: insulator, 468: insulator, 470: region, 474a: region, 474b: region, 476a: conductor, 476b: conductor, 478a: conductor, 478b: conductor, 478c: conductor, 480a: conductor, 480b: conductor, 480c: conductor, 490: transistor, 500: substrate, 501: insulator, 502: insulator, 504: conductor, 506: semiconductor, 508: insulator, 510: insulator, 512: insulator, 513: conductor, 516: conductor, 516a: conductor, 516b: conductor, 518: insulator, 524a: conductor, 524b: conductor, 526a: conductor, 526b: conductor, 538: insulator, 539: insulator, 590: transistor, 901: housing, 902: housing, 903: display portion, 904: display portion, 905: microphone, 906: speaker, 907: operation key, 908: stylus, 911: housing, 912: housing, 913: display portion, 914: display portion, 915: joint, 916: operation key, 921: housing, 922: display portion, 923: keyboard, 924: pointing device, 931: housing, 932: door for a refrigerator, 933: door for a freezer, 941: housing, 942: housing, 943: display portion, 944: operation key, 945: lens, 946: joint, 951: car body, 952: wheel, 953: dashboard, 954: light, 1189: ROM interface, 1190: substrate, 1191: ALU, 1192: ALU controller, 1193: instruction decoder, 1194: interrupt controller, 1195: timing controller, 1196: register, 1197: register controller, 1198: bus interface, 1199: ROM, 1200: memory element, 1201: circuit, 1202: circuit, 1203: switch, 1204: switch, 1206: logic element, 1207: capacitor, 1208: capacitor, 1209: transistor, 1210: transistor, 1213: transistor, 1214: transistor, 1220: circuit, 2100: transistor, 2200: transistor, 3001: wiring, 3002: wiring, 3003: wiring, 3004: wiring, 3005: wiring, 3200: transistor, 3300: transistor, 3400: capacitor, 5000: substrate, 5001: pixel portion, 5002: scan line driver circuit, 5003: scan line driver circuit, 5004: signal line driver circuit, 5010: capacitor line, 5012: scan line, 5013: scan line, 5014: signal line, 5016: transistor, 5017: transistor, 5018: liquid crystal element, 5019: liquid crystal element, 5020: pixel, 5021: switching transistor, 5022: driver transistor, 5023: capacitor, 5024: light-emitting element, 5025: signal line, 5026: scan line, 5027: power supply line, 5028: common electrode.

This application is based on Japanese Patent Application serial no. 2014-069534 filed with Japan Patent Office on Mar. 28, 2014, the entire contents of which are hereby incorporated by reference.

The invention claimed is:

1. A semiconductor device comprising:
a first insulating layer;
a first oxide semiconductor layer over the first insulating layer;
a second oxide semiconductor layer over the first oxide semiconductor layer;
a second insulating layer over the second oxide semiconductor layer;
a gate electrode provided in an opening in the second insulating layer;
a gate insulating layer provided between the second oxide semiconductor layer and the gate electrode; and
a third oxide semiconductor layer provided between the second oxide semiconductor layer and the gate insulating layer,
wherein in a section of a channel width direction, a bottom surface of the gate electrode has a region which does not overlap with the first oxide semiconductor layer and the second oxide semiconductor layer, and
wherein the region of the bottom surface of the gate electrode is located below a bottom surface of the first oxide semiconductor layer.

2. The semiconductor device according to claim 1, wherein the first oxide semiconductor layer overlaps with a protruding portion of the first insulating layer.

3. The semiconductor device according to claim 1, wherein the first oxide semiconductor layer comprises indium.

4. A semiconductor device comprising:
a first insulating layer;
a first oxide semiconductor layer over the first insulating layer;
a second oxide semiconductor layer over the first oxide semiconductor layer;

a second insulating layer over the second oxide semiconductor layer;
a gate electrode provided in an opening in the second insulating layer; and
a gate insulating layer provided between the second oxide semiconductor layer and the gate electrode,
wherein in a section of a channel width direction, a bottom surface of the gate electrode has a region which does not overlap with the first oxide semiconductor layer and the second oxide semiconductor layer, and
wherein the region of the bottom surface of the gate electrode is located below a bottom surface of the first oxide semiconductor layer.

5. The semiconductor device according to claim 4, wherein the first oxide semiconductor layer overlaps with a protruding portion of the first insulating layer.

6. The semiconductor device according to claim 4, wherein the first oxide semiconductor layer comprises indium.

7. A semiconductor device comprising:
a first insulating layer;
a first oxide semiconductor layer over the first insulating layer;
a second insulating layer over the first oxide semiconductor layer;
a gate electrode provided in an opening in the second insulating layer; and
a gate insulating layer provided between the first oxide semiconductor layer and the gate electrode;
a second oxide semiconductor layer provided between the first oxide semiconductor layer and the gate electrode;
wherein in a section of a channel width direction, a bottom surface of the gate electrode has a region which does not overlap with the first oxide semiconductor layer, and
wherein the region of the bottom surface of the gate electrode is located below a bottom surface of the first oxide semiconductor layer.

8. The semiconductor device according to claim 7, wherein the first oxide semiconductor layer overlaps with a protruding portion of the first insulating layer.

9. The semiconductor device according to claim 7, wherein the first oxide semiconductor layer comprises indium.

* * * * *